US008218782B2

(12) United States Patent
Asada et al.

(10) Patent No.: US 8,218,782 B2
(45) Date of Patent: Jul. 10, 2012

(54) HEADPHONE DEVICE, SIGNAL PROCESSING DEVICE, AND SIGNAL PROCESSING METHOD

(75) Inventors: Kohei Asada, Kanagawa (JP); Tetsunori Itabashi, Kanagawa (JP); Noriyuki Ozawa, Tokyo (JP)

(73) Assignee: Sony Corporation, Tokyo (JP)

( * ) Notice: Subject to any disclaimer, the term of this patent is extended or adjusted under 35 U.S.C. 154(b) by 567 days.

(21) Appl. No.: 12/409,830

(22) Filed: Mar. 24, 2009

(65) Prior Publication Data

US 2009/0245529 A1 Oct. 1, 2009

(30) Foreign Application Priority Data

Mar. 28, 2008 (JP) ................................ 2008-087322

(51) Int. Cl.
*G10K 11/16* (2006.01)
*H03B 29/00* (2006.01)

(52) U.S. Cl. ...................................................... 381/71.6

(58) Field of Classification Search ....... 381/71.1–71.14
See application file for complete search history.

(56) References Cited

U.S. PATENT DOCUMENTS

| | | | | |
|---|---|---|---|---|
| 5,251,263 | A | 10/1993 | Andrea et al. | |
| 5,689,572 | A * | 11/1997 | Ohki et al. | 381/71.3 |
| 5,937,070 | A | 8/1999 | Todter et al. | |
| 7,340,064 | B2 * | 3/2008 | Onishi et al. | 381/71.11 |
| 2004/0240677 | A1 * | 12/2004 | Onishi et al. | 381/71.4 |
| 2008/0192948 | A1 * | 8/2008 | Kan et al. | 381/71.4 |

FOREIGN PATENT DOCUMENTS

| | | | |
|---|---|---|---|
| GB | 2330048 | A | 10/1997 |
| JP | 02-039799 | A | 2/1990 |
| JP | 03-096199 | | 4/1991 |
| JP | 03-214892 | | 9/1991 |
| JP | 06-503897 | T | 4/1994 |
| JP | 07-264699 | A | 10/1995 |
| JP | 8-160994 | A | 6/1996 |
| JP | 2001-228892 | A | 8/2001 |
| JP | 2004-325284 | A | 11/2004 |
| JP | 2005-189836 | A | 7/2005 |

(Continued)

OTHER PUBLICATIONS

MATLAB Multimedia Signal Processing Music, Image, Transmission; Chpt 5, pp. 67-75 (w/Fig. 5.1).

(Continued)

*Primary Examiner* — Jeffrey Donels
(74) *Attorney, Agent, or Firm* — Wolf, Greenfield & Sacks, P.C.

(57) ABSTRACT

A headphone device includes: a sound reproduction unit having a diaphragm which is configured to perform sound reproduction based on a sound signal; a sound pickup unit configured to perform a sound pickup operation; a filtering unit configured to apply filtering to a picked-up sound signal obtained by the sound pickup unit, to give a noise-cancelling signal characteristic; a combining unit configured to combine the picked-up sound signal that has undergone filtering, and a listening sound signal which is inputted separately, to generate a sound signal supplied to the sound reproduction unit; and an abnormality determination unit configured to determine occurrence or non-occurrence of an abnormal sound, on the basis of a result of level detection of a sound signal obtained within a sound signal processing system that includes the filtering unit and the combining unit and is formed between the sound pickup unit and the sound reproduction unit.

15 Claims, 12 Drawing Sheets

FOREIGN PATENT DOCUMENTS

| | | | |
|---|---|---|---|
| JP | 2007-002393 | A | 1/2007 |
| JP | 2007-108522 | A | 4/2007 |
| JP | 2007-110536 | A | 4/2007 |
| JP | 2007-193035 | A | 8/2007 |
| JP | 2007-212611 | A | 8/2007 |
| JP | 2007-243739 | A | 9/2007 |
| JP | 2007-259241 | A | 10/2007 |
| JP | 2007-336460 | A | 12/2007 |
| JP | 2008-028937 | A | 2/2008 |
| JP | 2008-042508 | A | 2/2008 |
| JP | 2008-092365 | A | 4/2008 |
| JP | 2008-122729 | A | 5/2008 |
| JP | 2008-124792 | | 5/2008 |
| JP | 2008-197438 | | 8/2008 |
| WO | WO 2008/070005 | A2 | 6/2008 |

OTHER PUBLICATIONS

Tozawa et al., "Musical Noise Reduction Using Morphology Process in Spectral Subtraction", The 18$^{th}$ Workshop on Circuits and Systems in Karuizawa; Apr. 25-26, 2005, pp. 159-164.

* cited by examiner

15

HEADPHONE DEVICE, SIGNAL PROCESSING DEVICE, AND SIGNAL PROCESSING METHOD

CROSS REFERENCES TO RELATED APPLICATIONS

The present invention contains subject matter related to Japanese Patent Application JP 2008-087322 filed in the Japanese Patent Office on Mar. 28, 2008, the entire contents of which are incorporated herein by reference.

BACKGROUND OF THE INVENTION

1. Field of the Invention

The present invention relates to a headphone device having a noise cancelling function, and a signal processing device having a noise cancelling function. Also, the present invention relates to a signal processing method that is suitable for application to a noise cancelling system.

2. Description of the Related Art

In the related art, so-called noise cancelling systems exist and have been put into practical use which are adapted for use in a headphone device and which are configured to actively cancel an external noise that is heard when reproducing the sound of content such as a tune via a headphone device. Broadly speaking, two schemes exist for such noise cancelling systems: a feedback scheme and a feedforward scheme.

For example, Japanese Unexamined Patent Application Publication No. 3-214892 describes the following configuration as a configuration of a noise cancelling system based on the feedback scheme. According to the configuration, a sound signal is generated by inverting the phase of a noise inside a sound tube picked up by a microphone unit that is provided in proximity to an earphone (headphone) unit within the sound tube worn on the ear of a user, and this sound signal is outputted as a sound from the earphone unit, thus reducing an external noise.

Also, Japanese Unexamined Patent Application Publication No. 3-96199 describes, as a configuration of a noise cancelling system based on the feedforward scheme, a configuration in which, basically, a characteristic based on a predetermined transfer function is given to a sound signal obtained by picking up a sound by a microphone attached to the outer casing of a headphone device, and the resulting sound signal is outputted from the headphone device.

When either of the feedforward scheme and the feedback scheme is adopted, the filter characteristic to be set for noise cancelling is set in such a way that noise is cancelled at the position of the user's ear, on the basis of the spatial transfer function for a sound from an external noise source to the position of the user's ear (noise cancellation point), and various transfer functions such as the microphone amplifier/headphone amplifier characteristics.

Under present circumstances, filters for noise cancelling (NC filters) are configured by an analog circuit. In cases where the NC filter is to be configured by an analog circuit, to variably set its filter characteristic for adaptation to different noise environments, for example, a plurality of filter circuits having different filter characteristics are provided, and these filter circuits are switched between each other to effect a change in filter characteristic. However, such a configuration is not practical from the viewpoint of the circuit mounting area or the like. As a result, under present circumstances, it is not possible to change the filter characteristic.

In view of the above-mentioned present circumstances, the present applicant has previously proposed a configuration in which a noise cancelling filter is realized by a digital circuit, as a configuration for variably setting the filter characteristic. That is, the noise cancelling filter is realized by a digital filter using, for example, an FIR (Finite Impulse Response) filter. By adopting a noise canceling system using such a digital filter, a change in filter characteristic can be effected by changing the filter configuration or filter coefficients, and the configuration can be simplified in comparison to the case where the filter is configured by an analog circuit. That is, the configuration for effecting a change in filter characteristic can be achieved in a realistic manner.

SUMMARY OF THE INVENTION

As already described above, the characteristic of an NC filter in a noise cancelling system should be set appropriately on the basis of the transfer functions of individual units that constitute the system. In this regard, among the individual units that constitute a headphone device, acoustic parts such as a driver unit (diaphragm unit) and a microphone (for noise pickup) exert a particularly large influence on the quality of a sound listened to by the user. In other words, importance should be placed on the characteristics of these acoustic parts in setting the characteristic of the NC filter.

However, these acoustic parts are subject to change (deformation) due to time variation (deterioration), or due to use under a special environment (for example, under a high pressure/low pressure environment or a high temperature/low temperature environment not normally assumed), which causes changes to acoustic characteristics. That is, due to such changes in the characteristics of acoustic parts, the filter characteristic of the NC filter initially set as appropriate is rendered inappropriate.

Also, in the case of a noise cancelling system in which the NC filter is not built in the headphone device itself but is provided on the side of a signal processing device (for example, an audio player with an NC function) to/from which the headphone device can be attached/detached, if the user connects a non-compatible headphone device by mistake, the characteristics of acoustic parts that constitute the headphone device become different from assumed characteristics, which similarly renders the characteristic of the NC filter inappropriate.

Naturally, when the characteristic of the NC filter is not appropriate, it is not possible to attain an expected noise cancelling effect.

Also, other than it is not possible to attain a noise cancelling effect, there is a risk of other problems. In a case where the above-described feedback scheme is adopted as the noise cancelling scheme, in particular, as the characteristic of the NC filter is thus rendered inappropriate, occurrence of an unusual sound is aggravated or, depending on the case, even the possibility of inducing an oscillation may not be precluded.

Meanwhile, it has been mentioned in the above description that the NC filter is implemented by a digital filter. In the case where the NC filter is configured by a digital filter as described above, when an abnormality such as a bit shift occurs in a digital device (such as a DSP: Digital Signal Processor, an A/D converter, or a D/A converter) due to some cause such as a breakdown, there is a fear that an unusual sound or oscillation may be induced.

Occurrence of an unusual sound gives discomfort to the user. Also, in the event should an oscillation occur, this makes such a headphone device extremely undesirable as a product to be used in the user's ears, and hence it is desired to prevent the occurrence of such a problem in advance.

A headphone device according to an embodiment of the present invention includes: sound reproduction means having a diaphragm for performing sound reproduction based on a sound signal; sound pickup means for performing a sound pickup operation; filtering means for applying filtering to a picked-up sound signal, which is obtained on the basis of the sound pickup operation by the sound pickup means, to give a noise-cancelling signal characteristic; combining means for combining the picked-up sound signal that has undergone filtering by the filtering means, and a listening sound signal which is inputted separately as a sound to be listened to by a user, to generate a sound signal supplied to the sound reproduction means; and abnormality determination means for determining occurrence or non-occurrence of an abnormal sound, on the basis of a result of detecting a level of a sound signal obtained within a sound signal processing system, the sound signal processing system including the filtering means and the combining means and being formed between the sound pickup means and the sound reproduction means.

Further, a signal processing device according to an embodiment of the present invention includes: filtering means for applying filtering to a picked-up sound signal to give a noise-cancelling signal characteristic, in a headphone device including sound reproduction means having a diaphragm for performing sound reproduction based on a sound signal, and sound pickup means for performing a sound pickup operation, the picked-up sound signal being obtained on the basis of the sound pickup operation by the sound pickup means; combining means for combining the picked-up sound signal that has undergone filtering by the filtering means, and a listening sound signal which is inputted separately as a sound to be listened to by a user, to generate a sound signal supplied to the sound reproduction means of the headphone device; and abnormality determination means for determining occurrence or non-occurrence of an abnormal sound, on the basis of a result of detecting a level of a sound signal obtained within a sound signal processing system, the sound signal processing system including the filtering means and the combining means and being formed between the sound pickup means and the sound reproduction means.

Further, a signal processing method according to an embodiment of the present invention is a signal processing method for a noise cancelling system, the noise cancelling system including: filtering means for applying filtering to a picked-up sound signal to give a noise-cancelling signal characteristic, in a headphone device including sound reproduction means having a diaphragm for performing sound reproduction based on a sound signal, and sound pickup means for performing a sound pickup operation, the picked-up sound signal being obtained on the basis of the sound pickup operation by the sound pickup means; and combining means for combining the picked-up sound signal that has undergone filtering by the filtering means, and a listening sound signal which is inputted separately as a sound to be listened to by a user, to generate a sound signal supplied to the sound reproduction means, the signal processing method including determining occurrence or non-occurrence of an abnormal sound on the basis of a result of detecting a level of a sound signal obtained within a sound signal processing system, the sound signal processing system including the filtering means and the combining means and being formed between the sound pickup means and the sound reproduction means.

When an unusual sound or an abnormal sound associated with oscillation is occurring in a noise cancelling system due to changes in the characteristics of acoustic parts such as a microphone and a diaphragm, a breakdown in a digital device, or the like, a corresponding change occurs in the signal level obtained by the above-mentioned sound signal processing system. Accordingly, in an embodiment of the present invention, occurrence or non-occurrence of an abnormal sound is determined on the basis of the result of detecting the level of a sound signal obtained within the sound signal processing system as mentioned above.

This makes it possible to appropriately determine the occurrence or non-occurrence of an abnormality in the noise cancelling system, such as an unusual sound or oscillation due to deterioration/deformation or the like of an acoustic part such as a diaphragm unit or a microphone, or an abnormality such as an unusual sound or oscillation due to a breakdown in a digital device or the like.

As mentioned above, according to an embodiment of the present invention, it is possible to appropriately determine the occurrence or non-occurrence of an abnormality in the noise cancelling system, such as an unusual sound or oscillation due to deterioration/deformation or the like of an acoustic part such as a diaphragm unit or a microphone, or an abnormality such as an unusual sound or oscillation due to a breakdown in a digital device or the like.

This allows appropriate countermeasures to be taken in correspondence to situations in which an abnormality such as an unusual sound or oscillation has occurred, thereby making it possible to realize a superior noise cancelling system that does not give the user discomfort due to an unusual sound or is free from the risk of oscillation.

DESCRIPTION OF THE PREFERRED EMBODIMENTS

The best mode for carrying out the present invention (hereinafter, referred to as embodiment) will be described.

First, before describing a configuration according to this embodiment, the basic concept of a noise cancelling system will be described.

<Basic Concept of Noise Cancelling System>

As the basic scheme for a noise cancelling system according to the related art, there are a feedback (FB) scheme that performs servo control, and a feedforward (FF) scheme. First, the FB scheme will be described with reference to FIGS. 1A and 1B.

Figure 1B:
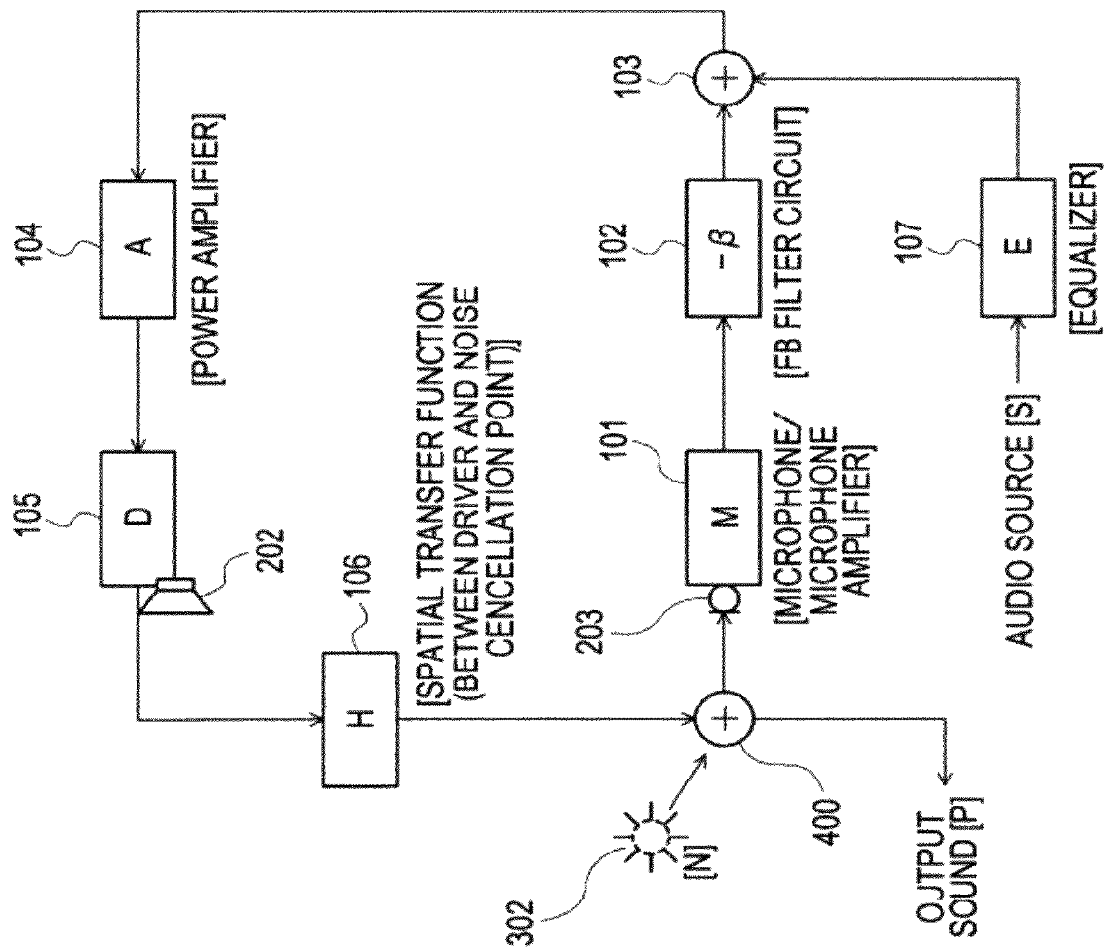
FIGS. 1A and 1B are diagrams each showing a model example of a noise cancelling system of a headphone device according to a feedback scheme.
Figure 1A:
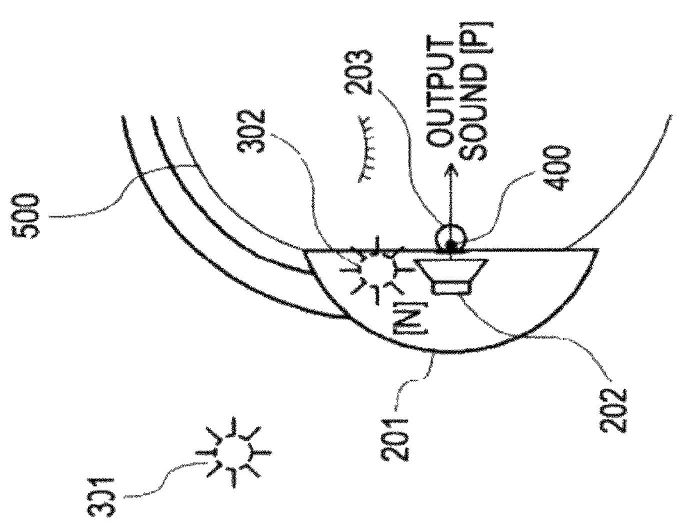

FIG. 1A schematically shows a model example of a noise cancelling system based on the FB scheme, on the side of the right ear (the R channel in a dual channel stereo with L (left) and R (right) channels) of a headphone wearer (user).

The structure on the R channel side of a headphone device in this case is such that, first, inside a housing unit 201 corresponding to the right ear, a driver 202 is provided at a position corresponding to the right ear of a user 500 who has worn the headphone device. The driver 202 is synonymous with a so-called speaker with a diaphragm. When driven by an amplified output of a sound signal, the driver 202 outputs sound in such a way as to release the sound into space.

With this structure, in the FB scheme, a microphone 203 is provided at a position inside the housing unit 201 close to the right ear of the user 500. The microphone 203 provided in this way picks up sound outputted from the driver 202, and sound that enters the housing unit 201 from an external noise source 301 and goes on to reach the right ear, that is, in-housing noise 302 that is an external sound listened to through the right ear. The in-housing noise 302 occurs when, for example, sound from the noise source 301 leaks as a sound pressure from a gap in an ear pad or the like of the housing unit, or when the casing of the headphone device vibrates upon receiving the sound pressure from the noise source 301, and this vibration is transmitted to the interior of the housing unit.

Then, from a sound signal obtained by sound pickup by the microphone 203, a signal (cancellation audio signal) for canceling (attenuating or reducing) the in-housing noise 302, for example, a signal having an inverse characteristic with respect to the sound signal component of an external sound is generated, and this signal is fed back so as to be combined with a sound signal (audio source) of a necessary sound for driving the driver 202. As a result, at a noise cancellation point 400 that is set at a position inside the housing unit 201 corresponding to the right ear, the components of the output sound from the driver 202 and of the external sound are combined to obtain a sound with the external sound cancelled, and the resulting sound is listened to through the right ear of the user. The above structure is also provided on the L-channel (left ear) side, thus obtaining a noise cancelling system as a headphone device corresponding to a common dual (L and R) channel stereo.

FIG. 1B is a block diagram showing a basic model configuration example of a noise cancelling system based on the FB scheme. In FIG. 1B, as in FIG. 1A, only the configuration corresponding to the R-channel (right ear) side is shown. The same system configuration is provided on the L-channel (left ear) side as well. Each block shown in this drawing represents a single specific transfer function corresponding to a specific circuit portion, circuit system, or the like in the noise cancelling system based on the FB scheme, and will herein be referred to as "transfer function block". A character written in each transfer function block represents a transfer function of the transfer function block. Each time a sound signal (or sound) passes through a transfer function block, the transfer function written in that transfer function block is given.

First, a sound picked up by the microphone 203 provided inside the housing unit 201 is obtained as a sound signal that has passed through a transfer function block 101 (transfer function: M) corresponding to the microphone 203 and a microphone amplifier that amplifies an electrical signal obtained by the microphone 203 and outputs the sound signal. The sound signal that has passed through the transfer function block 101 is inputted to a combiner 103 via a transfer function block 102 (transfer function: −β) corresponding to an FB (Feedback) filter circuit. The FB filter circuit is a filter circuit that is set to have a characteristic for generating the above-mentioned cancellation audio signal from the sound signal obtained by sound pickup by the microphone 203. The transfer function of the FB filter circuit is represented as −β.

It is assumed here that a sound signal S of the audio source, which is content such as a tune, is equalized by an equalizer. The sound signal S is inputted to the combiner 103 via a transfer function block 107 (transfer function: E) corresponding to this equalizer.

The reason why equalization is applied to the sound signal S in this way is attributed to the fact that in the FB scheme, the microphone 203 for noise pickup is provided inside the housing unit 201, and not only a noise sound but also an output sound from the driver 202 is picked up. That is, since the microphone 203 thus picks up the component of the sound signal S as well, the transfer function −β is given also to the sound signal S in the FB scheme, and this may cause degradation in the sound quality of the sound signal S. Accordingly, in order to suppress the degradation in sound quality due to the transfer function −β in advance, a desired signal characteristic is given to the sound signal S by equalization.

The combiner 103 combines the above-mentioned two signals together through addition. The thus combined sound signal is amplified by a power amplifier and outputted to the driver 202 as a drive signal, so the sound signal is outputted as a sound from the driver 202. That is, the sound signal outputted from the combiner 103 passes through a transfer function block 104 (transfer function: A) corresponding to the power amplifier, and then further passes through a transfer function block 105 (transfer function: D) corresponding to the driver 202 before being released into space as a sound. The transfer function D of the driver 202 is determined by, for example, the structure of the driver 202.

The sound outputted from the driver 202 arrives at the noise cancellation point 400 via a transfer function block 106 (transfer function: H) corresponding to the spatial path (spatial transfer function) from the driver 202 to the noise cancellation point 400, and is combined with the in-housing noise 302 in that space. Thus, the sound pressure P of an output sound that arrives at, for example, the right ear from the noise cancellation point 400 is obtained as one from which the sound from the noise source 301 entering from the outside of the housing unit 201 has been cancelled.

In the system of the model of the noise cancellation system shown in FIG. 1B, let N be the in-housing noise 302 and S be the sound signal of the audio source. Then, the sound pressure P of the output sound mentioned above is represented by [Equation 1] below, by using the transfer functions "M, −β, E, A, D, and H" written in the respective transfer function blocks.

[Eq. 1]

$$P = \frac{1}{1 + ADHM\beta}N + \frac{AHD}{1 + ADHM\beta}ES \quad \text{[Equation 1]}$$

Now, focusing attention on N that represents the in-housing noise 302, it is apparent that in [Equation 1] above, N is attenuated by a coefficient represented by 1/(1+ADHMβ).

However, in order for the system represented by [Equation 1] to operate stably without occurrence of oscillation in the frequency range for which noise is to be reduced, it is necessary that [Equation 2] below be satisfied.

[Eq. 2]

$$\left|\frac{1}{1+ADHM\beta}\right|<1 \quad \text{[Equation 2]}$$

Generally, considering the fact that the absolute value of the product of the individual transfer functions in the noise cancelling system based on the FB scheme is represented by 1<<|ADHMβ|, and the Nyquist stability criterion according to the classical control theory, [Equation 2] can be interpreted as follows.

Now, consider a system represented by (−ADHMβ), which is obtained by cutting the loop portion related to the in-housing noise 302, N, at one point in the noise cancelling system shown in FIG. 1B. This system will herein be referred to as "open loop". For example, the above-mentioned open loop can be formed when the above loop portion is cut at the point between the transfer function block 101 corresponding to the microphone and the microphone amplifier, and the transfer function block 102 corresponding to the FB filter circuit.

Figure 2:
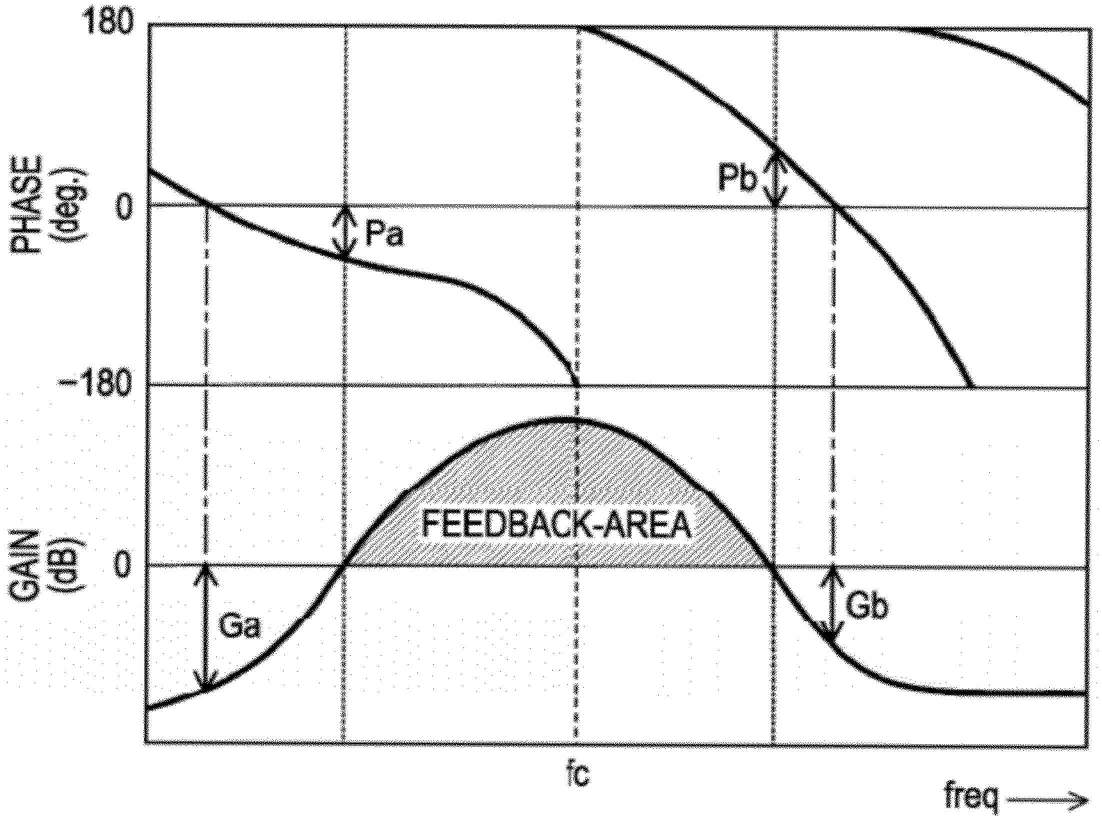
FIG. 2 is a Bode diagram showing the characteristics of the noise cancelling system shown in FIGS. 1A and 1B.

The above-mentioned open loop has characteristics as indicated by the Bode diagram of FIG. 2, for example. In this Bode diagram, the horizontal axis represents frequency, and the lower half of the vertical axis represents gain and the upper part thereof represents phase.

In the case of this open loop, in order for [Equation 2] to be satisfied, on the basis of the Nyquist stability criterion, it is necessary that the following two conditions be satisfied.

Condition 1: It is necessary that the gain should be less than 0 dB at the instant when the point of phase=0 deg. (0 degree) is passed.

Condition 2: It is necessary that the point of phase=0 deg. should not be included at the instant when the gain is equal to or greater than 0 dB.

When the above two Conditions 1 and 2 are not satisfied, a positive feedback is applied to the loop, causing oscillation (howling). In FIG. 2, phase margins Pa and Pb corresponding to Condition 1 above, and gain margins Ga and Gb corresponding to Condition 2 above are shown. If these margins are small, the probability of oscillation increases depending on various individual differences among users who use the headphone device to which the noise cancelling system is applied, variation among users as to how the headphone device is worn, and the like.

In FIG. 2, for example, the gain at the instant of passage of the point of phase=0 deg. is smaller than 0 dB, and the gain margins Ga and Gb are obtained accordingly. However, for example, provided that the gain at the instant of passage of the point of phase=0 deg. becomes equal to or greater than 0 dB and thus no gain margin Ga or Gb exists, or provided that the gain at the instant of passage of the point of phase=0 deg. is smaller than 0 dB but is close to 0 dB so that the gain margin Ga or Gb becomes small, oscillation occurs or the probability of oscillation increases.

Likewise, in FIG. 2, at the instant when the gain is equal to or greater than 0 dB, the point of phase=0 deg. is not passed, so the phase margins Pa and Pb are obtained. However, for example, if, at the instant when the gain is equal to or greater than 0 dB, the point of phase 0 deg. has been passed, or the phase is close to 0 deg. and thus the phase margins Pa and Pb become small, oscillation occurs or the probability of oscillation increases.

Next, a description will be given of a case in which, with the configuration of the noise cancelling system based on the FB scheme shown in FIG. 1B, a necessary sound is reproduced and outputted by the headphone device, in addition to the function of cancelling (reducing) an external sound (noise) described above.

In this case, the necessary sound is represented by, for example, the sound signal S of an audio source as content such as a tune.

The sound signal S is not limited to that of musical content or other such similar content. For example, in cases where the noise cancelling system is applied to a hearing aid or the like, the sound signal S is a sound signal obtained by sound pickup by a microphone (different from the microphone 203 provided in the noise cancelling system) provided on the outside of the casing to pick up a necessary ambient sound. Also, in cases where the noise cancelling system is applied to a so-called headset, the sound signal S is a sound signal of, for example, a speech by the other party received via communication such as telephone communication. That is, the sound signal S generically refers to types of sound to be reproduced and outputted in accordance with the intended applications of the headphone device.

First, attention is to be given to the sound signal S of the audio source in [Equation 1] mentioned above. It is assumed that the transfer function E corresponding to the equalizer is set to have a characteristic represented by [Equation 3] below.

[Eq. 3]

$$E=(1+ADHM\beta) \quad \text{[Equation 3]}$$

When viewed along the frequency axis, the transfer characteristic E above is substantially an inverse characteristic (1+open-loop characteristic) with respect to the above-mentioned open loop. Substituting the transfer function E as represented by [Equation 3] into [Equation 1] gives [Equation 4] which represents the sound pressure P of an output sound in the model of the noise cancelling system shown in FIG. 1B.

[Eq. 4]

$$P=\frac{1}{1+ADHM\beta}N+ADHS \quad \text{[Equation 4]}$$

Among the transfer functions A, D, and H in the term ADHS in [Equation 4], the transfer function A corresponds to the power amplifier, the transfer function D corresponds to the driver 202, and the transfer function H corresponds to the spatial transfer function of the path from the driver 202 to the noise cancellation point 400. Thus, it can be appreciated that if the microphone 203 inside the housing unit 201 is positioned in close proximity to the ear, a characteristic equivalent to that of a typical headphone not having a noise cancellation function is obtained with respect to the sound signal S.

Next, a noise cancelling system based on the FF scheme will now be described below.

Figures 3A, 3B:
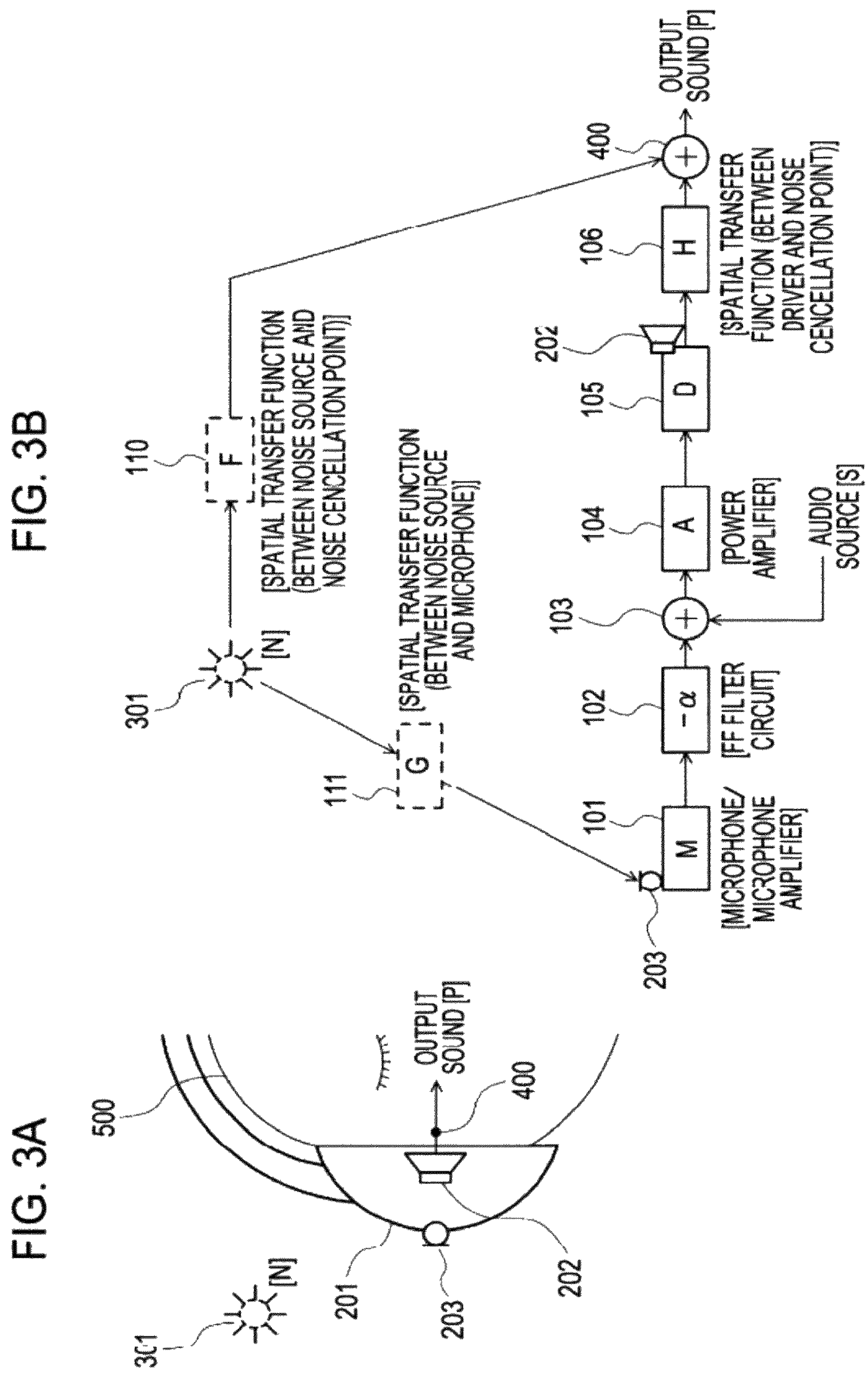
FIGS. 3A and 3B are diagrams each showing a model example of a noise cancelling system of a headphone device according to a feedforward scheme.

FIG. 3A illustrates a model example of the noise cancelling system based on the FF scheme. As in FIG. 1A, FIG. 3A shows a configuration on the side corresponding to the R channel.

In the FF scheme, the microphone 203 is provided on the outside of the housing unit 201 so that a sound arriving from the noise source 301 can be picked up. The external sound picked up by the microphone 203, that is, the sound arriving from the noise source 301 is picked up to obtain a sound signal, and appropriate filtering is applied to this sound signal, thus generating a cancellation sound signal. Then, this cancellation sound signal is combined with the sound signal of a necessary sound. That is, a cancellation sound signal, which electrically simulates the acoustic characteristic of the path from the position of the microphone 203 to the position of the driver 202, is combined with the sound signal of the necessary sound.

Then, the sound signal thus obtained by combining the cancellation sound signal and the sound signal of the necessary sound is outputted via the driver 202. Thus, as a sound obtained at the noise cancellation point 400, a sound from which the sound that has entered the housing unit 201 from the noise source 301 has been cancelled is heard.

FIG. 3B shows, as a basic model configuration example of the noise cancelling system based on the FF scheme, a configuration on the side corresponding to one channel (the R channel).

First, a sound picked up by the microphone 203 provided outside the housing unit 201 is obtained as a sound signal that has passed through the transfer function block 101 corresponding to the microphone 203 and the microphone amplifier.

Then, the sound signal that has passed through the transfer function block 101 is inputted to the combiner 103 via the transfer function block 102 (transfer function: $-\alpha$) corresponding to an FF (FeedForward) filter circuit. The FB filter circuit is a filter circuit that is set to have a characteristic for generating the above-mentioned cancellation audio signal from the sound signal obtained by sound pickup by the microphone 203. The transfer function of the FB filter circuit is represented as $-\alpha$.

In this case, the sound signal S of an audio source is directly inputted to the combiner 103.

The sound signal combined by the combiner 103 is amplified by the power amplifier and outputted to the driver 202 as a driving signal, so the sound signal is outputted as a sound from the driver 202. That is, in this case as well, the sound signal outputted from the combiner 103 passes through the transfer function block 104 (transfer function: A) corresponding to the power amplifier, and then further passes through the transfer function block 105 (transfer function: D) corresponding to the driver 202 before being released into space as a sound.

Then, the sound outputted from the driver 202 arrives at the noise cancellation point 400 via the transfer function block 106 (transfer function: H) corresponding to the spatial path (spatial transfer function) from the driver 202 to the noise cancellation point 400, and is combined with the in-housing noise 302 in that space.

As indicated as a transfer function block 110, before the sound emitted from the noise source 301 reaches the noise cancellation point 400 after entering the housing unit 201, the sound is given a transfer function (a spatial transfer function F) corresponding to the path from the noise source 301 to the noise cancellation point 400. Meanwhile, the microphone 203 picks up an external sound, that is, a sound arriving from the noise source 301. At this time, as indicated as a transfer function block 111, before the sound (noise) emitted from the noise source 301 reaches the microphone 203, the sound is given a transfer function (a spatial transfer function G) corresponding to the path from the noise source 301 to the microphone 203. For the FF filter circuit corresponding to the transfer function block 102, a transfer function $-\alpha$ is set while also taking the above-mentioned spatial transfer functions F and G into account.

Thus, the sound pressure P of an output sound that arrives at, for example, the right ear from the noise cancellation point 400 is obtained as one from which the sound from the noise source 301 that enters from the outside of the housing unit 201 has been cancelled.

In the system of the model of the noise cancellation system based on the FF scheme shown in FIG. 3B, let N be the noise emitted from the noise source 301 and S be the sound signal of the audio source, then the sound pressure P of the output sound mentioned above is represented by [Equation 5] below, by using the transfer functions "M, $-\alpha$, E, A, D, and H" written in the respective transfer function blocks.

[Eq. 5]

$$P=-GADHM\alpha N+FN+ADHS \qquad \text{[Equation 5]}$$

Ideally, the transfer function F of the path from the noise source 301 to the noise cancellation point 400 is given by Equation 6 below.

[Eq. 6]

$$F=GADHM\alpha \qquad \text{[Equation 6]}$$

Substituting [Equation 6] into [Equation 5] results in cancellation of the first and second terms on the right-hand side. As a result, the sound pressure P of the output sound can be represented by [Equation 7] below.

[Eq. 7]

$$P=ADHS \qquad \text{[Equation 7]}$$

This indicates that the sound arriving from the noise source 301 is cancelled, so that only the sound signal from the audio source is obtained as a sound. That is, in theory, a noise-cancelled sound is heard by the right ear of the user. In practice, however, it is extremely difficult to construct a perfect FF filter circuit that can give a transfer function that perfectly satisfies [Equation 6]. Moreover, it is generally regarded that there are relatively large differences among individuals in terms of the shape of the ears and how the headphone device is worn, and a change in the relationship between a position where noise occurs and the position of the microphone, or the like affects the noise reduction effect, particularly with respect to the middle and high frequency ranges. For this reason, with regard to the middle and high frequency ranges, it is often the case that an active noise reduction process is avoided, and mainly passive sound insulation that is dependent on the structure of the housing of the headphone device or the like is performed.

It should be noted here that [Equation 6] means that the transfer function of the path from the noise source 301 to the ear is imitated by an electric circuit including the transfer function $-\alpha$.

In the noise cancelling system based on the FF scheme shown in FIG. 3A, the microphone 203 is provided on the outside of the housing. Thus, unlike in the noise cancelling system based on the FB scheme shown in FIG. 1A, the noise cancellation point 400 can be set arbitrarily at a position inside the housing unit 201 corresponding to the position of the ear of the listener. Under normal conditions, however, the transfer function $-\alpha$ is fixed, and at the design phase, the transfer function $-\alpha$ is designed for a certain target characteristic. Meanwhile, the shape of the ears and the like differ from user to user. Accordingly, there is a possibility that a sufficient noise cancellation effect is not attained, or that a noise component is added in a non-opposite phase, resulting in a phenomenon such as occurrence of an unusual sound.

It is thus generally regarded that although the probability of oscillation is low and the stability is high in the case of the FF scheme, it is difficult to achieve sufficient noise reduction (cancellation). On the other hand, while a large noise reduction can be expected in the case of the FB scheme, care should be taken about system stability. Thus, the FB scheme and the FF scheme have their own distinct characteristics.

<First Embodiment>

[Configuration of Headphone Device]

Figure 4:
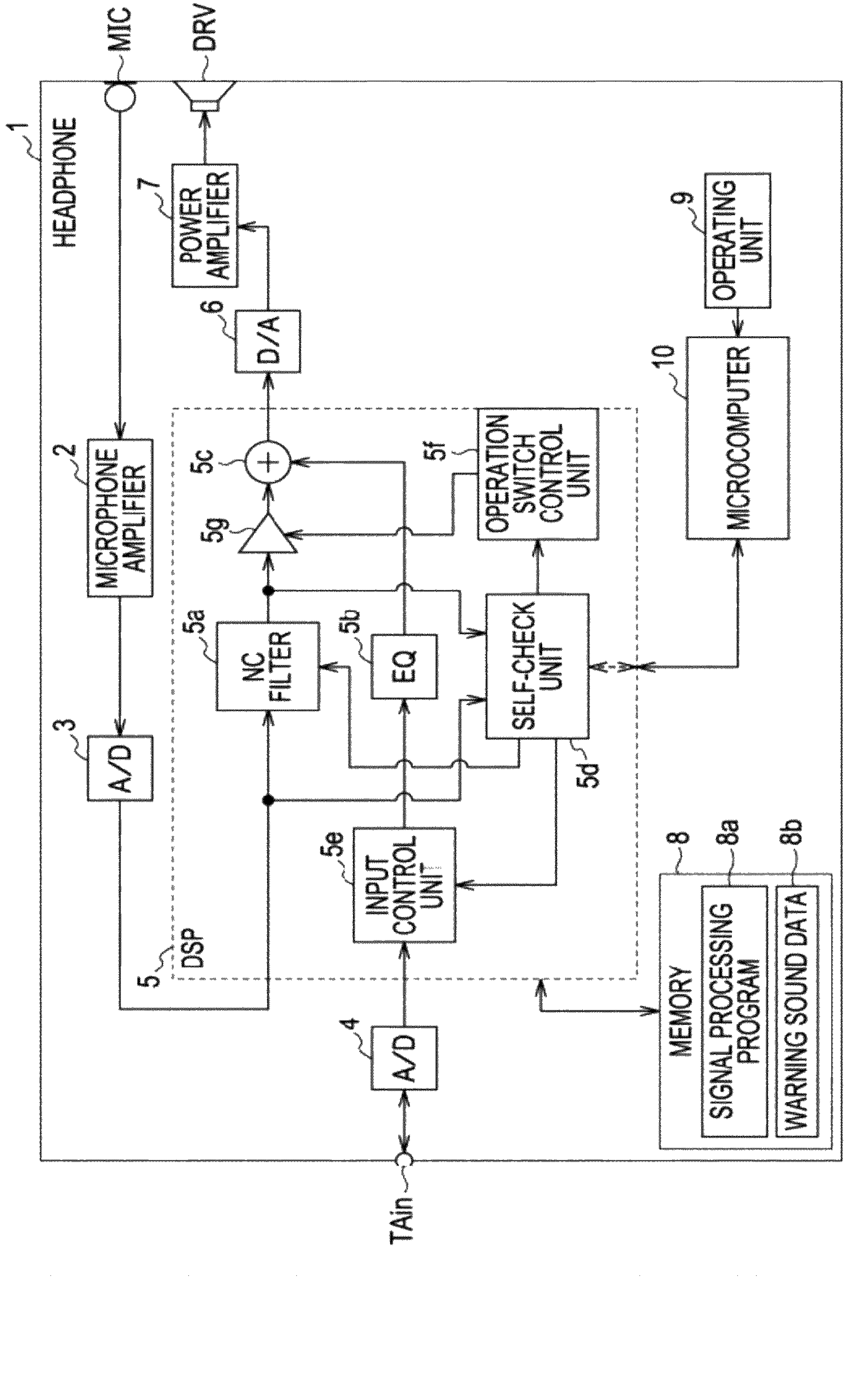
FIG. 4 is a block diagram showing the internal configuration of a headphone device according to a first embodiment.

FIG. 4 is a block diagram showing the internal configuration of the headphone device 1 according to an embodiment of the present invention.

First, the headphone 1 is provided with a microphone MIC as a component corresponding to the noise cancelling system. As illustrated in the drawing, a sound pickup signal picked up by the microphone MIC is amplified by a microphone amplifier 2, and then converted into a digital signal by an A/D converter 3 before being supplied to a DSP (Digital Signal Processor) 5. In the following, the sound pickup signal converted into a digital signal in the A/D converter 3 will be also referred to as sound pickup data.

In this case, the headphone 1 shown in FIG. 4 supports the feedback scheme as the noise cancelling scheme. As will be appreciated by reference to FIGS. 1A and 1B mentioned above, in the headphone device that supports the feedback scheme, the microphone MIC (the microphone 203 in FIGS. 1A and 1B) is provided so as to be placed inside the housing unit (201). Specifically, the microphone MIC in this case is provided so as to pick up sounds within the housing unit, that is, a noise sound and an output sound from the driver DRV (202 in FIGS. 1A and 1B).

Figure 5:
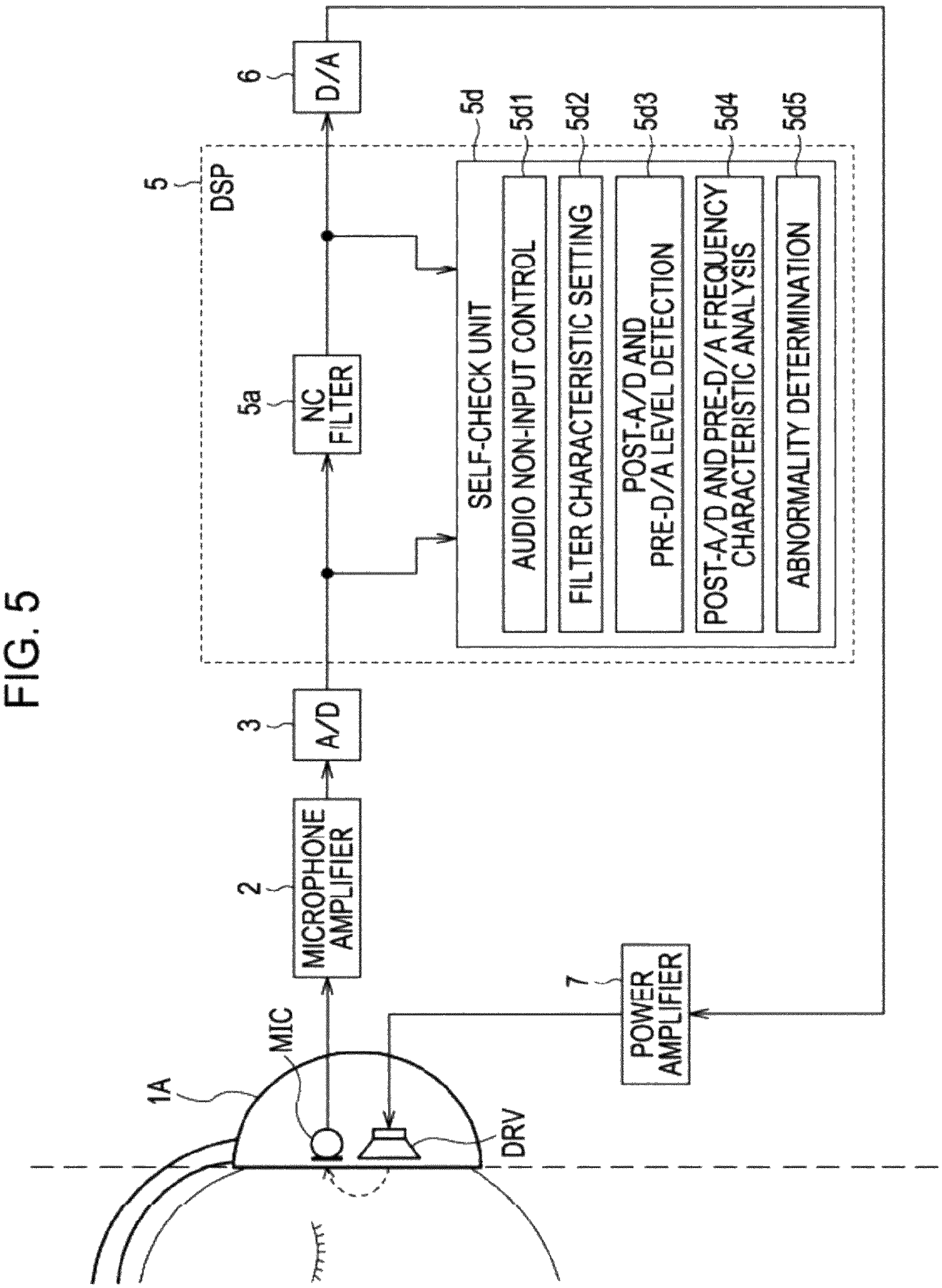
FIG. 5 is a diagram illustrating a self-check operation according to the first embodiment.

Incidentally, as illustrated in FIG. 5 described later, the housing unit included in the headphone 1 is a housing unit 1A.

Also, in FIG. 4, an audio signal (sound signal) supplied from an external audio player, for example, is inputted to the headphone 1 via an audio input terminal TAin shown in the drawing. The sound signal inputted from the audio input terminal TAin is supplied to the DSP 5 via the A/D converter 4.

The DSP 5 executes digital signal processing based on a signal processing program 8*a* stored in a memory 8 shown in the drawing, thereby realizing the operations of the individual functional blocks shown in the drawing.

With regard to the individual functional operations realized by the DSP 5 executing the digital signal processing based on the signal processing program 8*a* mentioned above, for the convenience of description, FIG. 4 shows both functional operations executed in association with the normal noise cancelling operation, and functional operations executed in association with a self-check operation according to this embodiment described later.

In the following, first, a description will be given of functional operations executed in association with the normal noise cancelling operation (sound reproduction).

The functional operations executed in association with the normal noise cancelling operation correspond to an NC (noise cancelling) filter 5*a*, an equalizer (EQ) 5*b*, and an addition unit 5*c*, among the individual functional blocks shown in the drawing.

In the following description of these functional blocks associated with the normal operation, the other functional blocks (a self-check unit 5*d*, an input control unit 5*e*, an operation switch control unit 5*f*, and a multiplication unit 5*g*) will be regarded as nonexistent.

First, at the time of normal noise cancelling operation, as a functional operation indicated as the equalizer (EQ) 5*b* in the drawing, an equalizing process is applied to an audio signal (audio data) inputted from the above-described audio input terminal TAin via the A/D converter 4. For example, the equalizer 5*b* can be realized by an FIR (Finite Impulse Response) filter, for example.

As will be understood from the description of the basic concept previously described, in the case of the FB scheme, since the filtering process for noise cancelling is performed within the feedback loop, there is a fear that a sound quality degradation may occur in the sound signal added to the feedback loop (i.e., the sound signal inputted to be listened to (perceived) by the user: listening sound signal). The functional operation indicated as the equalizer 5*b* mentioned above is performed for the purpose of preventing such sound quality degradation of the sound signal.

Also, as a functional operation indicated as the NC filter 5*a* shown in the drawing, a noise-cancelling signal characteristic is given to the above-described sound pickup data inputted from the microphone amplifier 2 via the A/D converter 3. The NC filter 5*a* is configured by, for example, an FIR filter.

Further, as a functional operation indicated as the addition unit 5*c* in the drawing, the audio data processed by the equalizer 5*b* described above, and the sound pickup data processed by the NC filter 5*a* mentioned above are added together. The data obtained by this addition process in the addition unit 5*c* is referred to as addition data. The addition data is added with the sound pickup data to which the characteristic for noise cancelling has been given by the NC filter 5*a* mentioned above. Therefore, when sound reproduction based on the addition data is performed by the driver DRV described above, the resulting sound can be perceived by the user wearing the headphone 1 as one from which noise components have been cancelled (removed).

In this way, at the time of normal sound reproduction, a sound based on the listening sound signal can be listened to by the user while making the sound be perceived as one from which noise components generated in the external environment have been canceled.

On the other hand, the DSP 5 also realizes the functional operations of the self-check unit 5*d*, the input control unit 5*e*, the operation switch control unit 5*f*, and the multiplication unit 5*g*, as the functional operations executed in association with the self-check operation described later. These functional operations according to this embodiment will be described later.

In this embodiment, as shown in the drawing, warning sound data 8*b* is stored in the memory 8. The warning sound data 8*b* will be also described later.

The addition data obtained in the DSP 5 as mentioned above is supplied to the D/A converter 6 and converted into an analog signal, and then amplified by a power amplifier 7 before being supplied to the driver DRV.

The driver DRV includes a diaphragm, and the diaphragm is driven on the basis of a sound signal (drive signal) supplied from the power amplifier 7 mentioned above, thus effecting sound output (sound reproduction) based on the above-mentioned sound signal.

The microcomputer 10 includes, for example, a ROM (Read Only Memory), a RAM (Random Access Memory), a CPU (Central Processing Unit), and the like. The microcomputer 10 controls the entire headphone 1 by performing various control processes and computations based on a program stored in the ROM mentioned above, for example.

As illustrated in the drawing, an operating unit 9 is connected to the microcomputer 10. The operating unit 9 includes, for example, an operating element (not shown) provided so as to appear on the outer surface of the casing of the headphone 1. The user makes various operation inputs with the operating unit 9. Information inputted with the operating unit 9 is transmitted as operation input information to the microcomputer 10. The microcomputer 10 performs necessary computation or control in accordance with the inputted information.

For example, a power button for instructing a turn-ON/OFF of the power supply of the headphone 1 can be given as an example of the operating element equipped to the operating unit 9 mentioned above. The microcomputer 10 performs ON/OFF control of the power supply of the headphone 1 on the basis of the operation input information supplied from the operating unit 9 mentioned above in accordance with an operation on the power button.

[Self-Check Operation]

The acoustic parts equipped to the headphone 1, such as the driver DRV and the microphone MIC (so-called transducer) undergo structural changes (deformations) due to time variation (deterioration), or due to use under a special environment (for example, under a high pressure/low pressure environment or a high temperature/low temperature environment not normally assumed), causing a change in acoustic characteristics. When a change occurs in the characteristics of acoustic parts as described above, the filter characteristics of the NC filter 5*a* originally set as appropriate become no longer appropriate.

When the characteristics of the NC filter 5*a* thus become no longer appropriate, not only does it become no longer possible to attain the expected noise cancelling effect, but, particularly in cases where the FB scheme is adopted as in this example, occurrence of an unusual sound is aggravated or, depending on the case, even the possibility of inducing an oscillation may not be precluded.

Also, in this example, the NC filter is realized as a digital filter by means of the DSP 5. In this case, if an abnormal operation such as a bit shift occurs in a digital device (such as the DSP 5, the A/D converter 3, or the D/A converter 6) due to some cause such as a breakdown, there is a fear that an unusual sound or oscillation may be induced.

Occurrence of an unusual sound gives discomfort to the user. Also, in the event an oscillation occurs and the oscillation is sustained, this makes such a headphone device extremely undesirable as a product to be used in the user's ears, and hence it is necessary to prevent such a problem in advance.

Accordingly, for example, this embodiment adopts a method of checking for the occurrence or non-occurrence of an abnormality such as an unusual sound or oscillation that can occur in the noise cancelling system due to the above-mentioned causes. Also, in accordance with the result of this check, countermeasures are taken to deal with the case when it is determined that an abnormality has occurred.

Accordingly, in the headphone 1 according to this embodiment, the functional operations as the self-check unit 5*d*, the input control unit 5*e*, the operation switch control unit 5*f*, and the multiplication unit 5*g* described above with reference to FIG. 4 are executed by the DSP 5.

In the following, a description will be given of the individual functional operations that are executed by the DSP 5 in association with the self-check operation. It should be noted in the following description that in FIG. 4, with regard to the above-mentioned functional operations realized by the DSP 5, it is depicted as if the individual functional blocks were configured as hardware in such a way that, for example, the self-check unit 5*d* works on the NC filter 5*a*, the input control unit 5*e*, and the like, and also that the operation switch control unit 5*f* works on the multiplication unit 5*g*. However, this is intended to facilitate the understanding of the functions included in the DSP 5, and should be taken as merely a conceptual illustration in the form of a block diagram of the individual functional operations realized by the DSP 5 executing digital signal processing based on a program (which in this case is the signal processing program 8*a*).

In FIG. 4, first, the self-check unit 5*d* in the drawing performs a self-check operation described later to check (determine) whether or not an abnormality has occurred.

The input control unit 5*e* controls the input of audio data inputted via the A/D converter 4. That is, the input control unit 5*e* controls input/non-input of the above-mentioned audio data.

The operation switch control unit 5*f* switches the operation of the DSP 5 as will be described later, in accordance with the result of the check (determination result) by the self-check unit 5*d*.

The multiplication unit 5*g* gives a designated gain to the sound pickup data that has undergone filtering by the NC filter 5*a*. This gain given by the multiplication unit 5*g* is designated by the functional operation as the operation switch control unit 5*f* mentioned above.

FIG. 5 is a diagram illustrating the self-check operation performed by the self-check unit 5*d* mentioned above.

FIG. 5 shows portions related to the self-check operation in this example which are extracted from among the components of the headphone 1 shown in FIG. 4. Specifically, the microphone MIC, the microphone amplifier 2, the A/D converter 3, the DSP 5, the D/A converter 6, the power amplifier 7, and the driver DRV are extracted.

FIG. 5 also shows the relative placement of the driver DRV and the microphone MIC inside the housing unit 1A of the headphone 1. As illustrated in the drawing, the microphone MIC in this case is placed inside the housing unit 1A together with the driver DRV.

In FIG. 5, the functional operation as the self-check unit 5*d* realized by the DSP 5 can be subdivided into an audio non-input control block 5*d*1, a filter characteristic setting block 5*d*2, a post-A/D and pre-D/A level detecting block 5*d*3, a post-A/D and pre-D/A frequency characteristic analysis block 5*d*4, and an abnormality determination block 5*d*5.

First, it is assumed as a precondition that in this embodiment, the self-check operation by the self-check unit 5*d* is started in response to an operation start instruction made to the DSP 5 by the microcomputer 10 when a predetermined condition is met, such as when the power supply of the headphone 1 is turned ON. That is, the operation by the self-check unit 5*d* is started in response to such an operation start instruction from the microcomputer 10.

The operation of the self-check unit 5*d* will be specifically described.

First, in response to the operation start instruction from the microcomputer 10 mentioned above, the audio non-input control block 5*d*1 in the drawing performs a control such that input of audio data from the A/D converter 4 is set to a non-input state by the input control unit 5*e* shown in FIG. 4 mentioned above. That is, in response to a self-check operation start instruction, first, a control is performed by the functional operation as the audio non-input control block 5*d*1 such that listening audio data is not added to the feedback loop.

In FIG. 5, the equalizer 5*b* and the addition unit 5*c* in FIG. 4 above are not shown. This indicates that due to the operation of the audio non-input control block 5*d*1 mentioned above, at the time of the self-check operation, an equalizing process and addition to the feedback loop is not performed with respect to the listening audio data.

Subsequently, after the audio non-input control mentioned above, a filter characteristic used for checking is set for the NC filter 5_a_ by the filter characteristic setting block 5_d_2 in the drawing. Parameter information for setting the filter characteristic for checking is stored as, for example, a part of the signal processing program 8_a_ within the memory 8. The filter characteristic setting block 5_d_2 mentioned above sets the filter characteristic for checking for the NC filter 5_a_ on the basis of the parameter information.

Upon executing the operations as the audio non-input control block 5_d_1 and the filter characteristic setting block 5_d_2 described above, in the headphone 1, a noise cancelling operation is performed in a state in which no listening audio signal component is included. That is, the listening audio signal component is not listened to but only a sound from which a noise sound has been cancelled (reduced) (ideally, no sound) is listened to by the user.

In this embodiment, the check operation described below is performed in a state with no audio signal component included, that is, in a state with no audio signal component added to the feedback loop, thereby improving the accuracy of determination of the occurrence or non-occurrence of an abnormal sound.

When the operation as the filter characteristic setting block 5_d_2 mentioned above is executed, the level of sound pickup data supplied from the A/D converter 3 to the NC filter 5_a_, and the level of sound pickup data supplied from the NC filter 5_a_ to the D/A converter 6 are detected by the post-A/D and pre-D/A level detection block 5_d_3.

Then, with respect to the sound pickup data supplied from the A/D converter 3 to the NC filter 5_a_, and the sound pickup data supplied from the NC filter 5_a_ to the D/A converter 6, their respective frequency characteristics are analyzed by the post-A/D and pre-D/A frequency characteristic analysis block 5_d_4. Specifically, the amplitude (level) is analyzed (detected) for each frequency range by performing a Fourier transform such as the FFT (Fast Fourier Transform), for example. Alternatively, level detection can be performed for each frequency range as well by using a plurality of BRFs (Band Pass Filters).

Further, after the operation in the post-A/D and pre-D/A frequency characteristic analysis block 5_d_4, an abnormality determination is performed by the abnormality determination block 5_d_5 on the basis of the result of level detection by the post-A/D and pre-D/A level detection block 5_d_3, and the result of frequency analysis by the post-A/D and pre-D/A level frequency characteristic analysis block 5_d_4.

The abnormality determination block 5_d_5 determines the occurrence or non-occurrence of an abnormal sound such as an unusual sound or oscillation sound, on the basis of the level of sound pickup data supplied from the A/D converter 3 to the NC filter 5_a_ (hereinafter, referred to as output signal from the A/D converter 3) and the level of sound pickup data supplied from the NC filter 5_a_ to the D/A converter 6 (hereinafter, referred to as input signal to the D/A converter 6), which are detected by the post-A/D and pre-D/A level detection block 5_d_3 mentioned above, and the level (amplitude level) of a predetermined frequency range with respect to the output signal from the A/D converter 3 and the level of a predetermined frequency range with respect to the input signal to the D/A converter 6, which are detected by the post-A/D and pre-D/A level frequency characteristic analysis block 5_d_4.

Specifically, it is determined whether or not the level of the output signal from the A/D converter 3 mentioned above, and the level of the input signal to the D/A converter 6 mentioned above is equal to or higher than a predetermined threshold (first threshold) defined in advance. Also, it is determined whether or not the level of a predetermined frequency range of the output signal from the A/D converter 3 mentioned above, and the level of a predetermined frequency range of the input signal to the D/A converter 6 mentioned above are equal to or higher than a predetermined second threshold defined in advance. Then, if a positive determination result in obtained in even one of these four determinations (that is, if the detected level is equal to or higher than a predetermined threshold), it is determined that an abnormal sound has occurred, and if the determination result is negative in all of the above determinations, it is determined that an abnormal sound has not occurred.

As mentioned above, in determining an abnormality, the abnormality determination block 5_d_5 performs a determination process with respect to the amplitude level of a predetermined frequency range. This is in view of the fact that a frequency range in which an unusual sound or oscillation sound occurs can be estimated to some extent. That is, in this case, as the frequency range subjected to the determination by the abnormality determination block 5_d_5, a range in which an unusual sound or oscillation sound is expected to occur in the actual configuration may be set.

Also, from this point of view, as the operation of the above-mentioned post-A/D and pre-D/A frequency characteristic analysis block 5_d_4 in this case, rather than performing level detection for each frequency range as described above, it suffices to perform level detection only for at least the above-mentioned predetermined frequency range in which an unusual sound or oscillation sound is expected to occur. The same effect can be attained in that case as well.

With the self-check unit 5_d_ having the respective functions as described above, occurrence/non-occurrence of an abnormality such as an unusual sound or oscillation can be checked in advance before a sound reproducing operation (noise cancelling/reproduction of a listening sound) is actually performed.

In this embodiment, after the check by the self-check unit 5_d_ mentioned above is made, on the basis of the check result (that is, the determination result as to the presence/absence of an abnormality), switching is made between a normal operation mode and an operation mode corresponding to an abnormal condition by the operation switch control unit 5_f_ shown in FIG. 4.

In FIG. 4, if it is determined by the self-check unit 5_d_ that there is no abnormality (an abnormal sound has occurred), the operation switch control unit 5_f_ performs a control for transition to the normal operation mode.

That is, first, a filter characteristic for audio reproduction is set for the NC filter 5_a_. Parameter information for setting this filter characteristic for audio reproduction is also stored in a part of the signal processing program 8_a_ within the memory 8, and the NC filter 5_a_ sets the filter characteristic for audio reproduction mentioned above for the NC filter 5_a_ on the basis of the parameter information.

Then, after setting such filter characteristics, the operation switch control unit 5_f_ performs a control such that audio data from the A/D converter 4 is inputted by the input control unit 5_e_.

Then, the NC filter 5_a_, the equalizer 6_b_, and the addition unit 5_c_ are activated so that the normal noise cancelling operation (including reproduction of the listening audio data) described above is started.

On the other hand, if it is determined by the self check unit 5_d_ that there is an abnormality (an abnormal sound has occurred), the operation switch control unit **5*f*** performs a control for transition to an abnormal-time operation mode.

That is, first, a system reset is performed. That is, the DSP 5 is restarted in such a way as to reset the settings of the DSP 5 itself.

Next, by the multiplication unit **5*g*, a control is performed such that the gain given to the feedback loop is set to a low value. Specifically, in this case, by giving a coefficient of a predetermined value less than 1 to the multiplication unit 5*g***, a gain lower than that at the time of normal operation is set.

Then, a control is performed such that a warning notification is made to the user. That is, by adding warning sound data stored in the memory 8 in, for example, the addition unit **5*c***, a sound based on the warning sound data is outputted from the driver DRV.

The sound to be recorded as the above-mentioned warning sound data **8*b*** may be, for example, a Beep sound, or guidance voice (message voice) for notifying that an abnormality has occurred in the system.

It should be noted that the combining of the warning sound data mentioned above may be performed with respect to any sound data that is supplied to the D/A converter 6 in the end, such as the sound data before or after the filtering process by the NC filter **5*a*, the sound data before or after the equalizing process by the equalizer 5*b*, or the sound data after the addition process by the addition unit 5*c***.

After having performed the controls for the system reset, the gain setting (adjustment), and the warning notification mentioned above, the operation switch control unit **5*f* performs controls for the setting of filter characteristic for audio reproduction, the input of audio data, and the start of operations of the NC filter 5*a*, the equalizer 5*b*, and the addition unit 5*c***, as in the case of the normal operation mode described above.

Through the above-mentioned operation of the operation switch control unit **5*f***, when in the abnormal-time operation mode, after the system is reset and warning is given to the user, a noise cancelling operation including audio reproduction is executed in a state in which a gain lower than that at the time of normal operation is set for the feedback loop.

Figure 6:
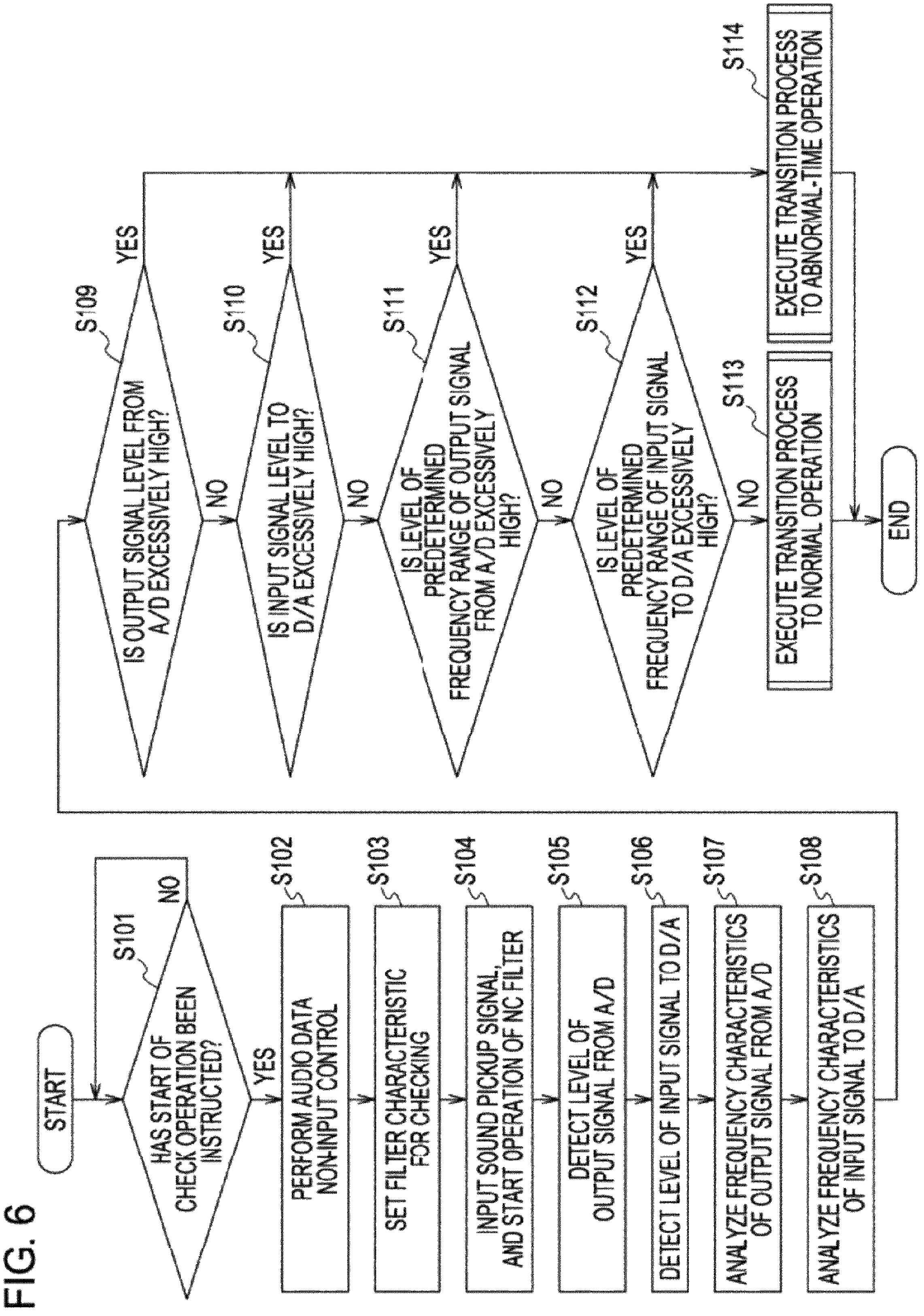
FIG. 6 is a flowchart showing a procedure for realizing the self-check operation (and operation switch control) according to the first embodiment.

The flowchart in FIG. 6 shows a procedure for realizing the self-check operation (including the operation switch control) according to the first embodiment described above.

In FIG. 6, the procedure for realizing the self-check operation according to the first embodiment is shown as a procedure that is executed by the DSP 5 on the basis of the signal processing program **8*a***.

In FIG. 6, first, in step S101, a check operation start instruction from the microcomputer 10 is waited for. That is, a check operation start instruction that is made by the microcomputer 10 in response to, for example, a power ON operation as described above is waited for.

When the above-mentioned check operation start instruction is made, in step S102, an audio data non-input control process is performed. That is, by controlling, for example, a switch as the input control unit **5*e* shown in FIG. 4, the listening audio data from the A/D converter 4** is switched to a non-input state.

In step S103 that follows, a filter characteristic for checking is set. That is, on the basis of parameter information stored in the memory 8, a filter characteristic for checking is set as the filter characteristic of the NC filter **5*a***.

In the next step S104, a sound pickup signal input and NC filter operation start process is executed. That is, input of sound pickup data from the A/D converter 3 is started, and filtering on the sound pickup data by the NC filter **5*a*** is started.

In this case, since sound reproduction is not performed with respect to the listening audio data, the operation as the addition unit **5*c* is not performed, and sound pickup data to which filtering has been applied by the NC filter 5*a* mentioned above is supplied to the D/A converter 6**.

In step S105 that follows, the level of an output signal from the A/D converter 3 is detected.

Then, in the next step S106, the level of an input signal to the D/A converter 6 is detected.

Further, in the next step S107, a frequency analysis is performed on the output signal from the A/D converter 3, and in the next step S108, a frequency analysis is performed on the input signal to the D/A converter 6.

In step S109 that follows, it is determined whether or not the level of the output signal from the A/D converter 3 is excessively high. That is, it is determined whether or not the level of the output signal from the A/D converter 3 is equal to or higher than the first threshold set in advance.

If a negative determination result is obtained in step S109 indicating that the level of the output signal from the A/D converter 3 mentioned above is not equal to or higher than the first threshold, in step S110, it is determined whether or not the level of the input signal to the D/A converter 6 is excessively high (equal to or higher than the first threshold mentioned above). If a negative determination result is obtained in step S110 indicating that the level of the input signal to the D/A converter 6 mentioned above is not equal to or higher than the first threshold, the processing is advanced to step S111.

In step S111, it is determined whether or not the level of a predetermined frequency range of the output signal from the A/D converter 3 is excessively high. That is, it is determined whether or not the level of the output signal from the A/D converter 3 is equal to or higher than the second threshold set in advance. If a negative determination result is obtained in step S111 indicating that the level of a predetermined frequency range of the output signal from the A/D converter 3 mentioned above is not equal to or higher than the second threshold, in step S112, it is determined whether or not the level of a predetermined frequency range of the input signal to the D/A converter 6 is excessively high (equal to or higher than the second threshold mentioned above).

If a negative determination result is obtained in step S112 mentioned above indicating that the level of a predetermined frequency range of the input signal to the D/A converter 6 mentioned above is not equal to or higher than the second threshold, the processing is advanced to step S113 as shown in the drawing, and a transition process to the normal operation is executed. That is, in accordance with the fact that a negative determination result is obtained in all of the determination processes in steps S110 to S113 mentioned above, a transition process to a normal operation is executed.

On the other hand, if a positive determination result is obtained in any one of the determination processes in steps S110 to S113 mentioned above, that is, if one of the levels is determined to be excessively high, the processing is advanced to step S114 where a transition process to an abnormal-time operation is executed.

When the transition process in either step S113 or step S114 mentioned above is executed, the processing according to the self-check operation (and operation switch control) according to this embodiment ends.

Figure 7:
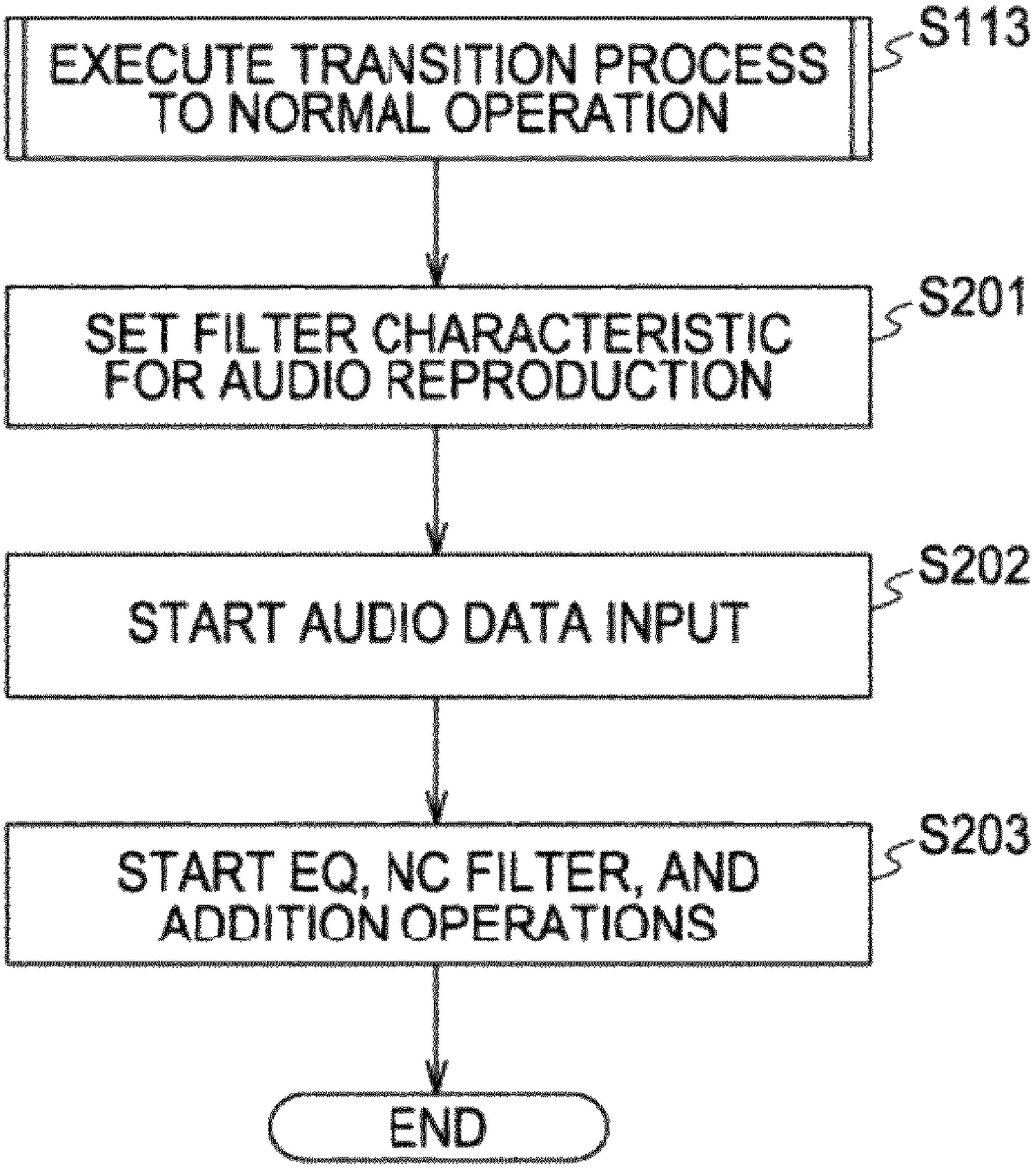
FIG. 7 is a flowchart showing the details of a transition process to a normal operation.
Figure 8:
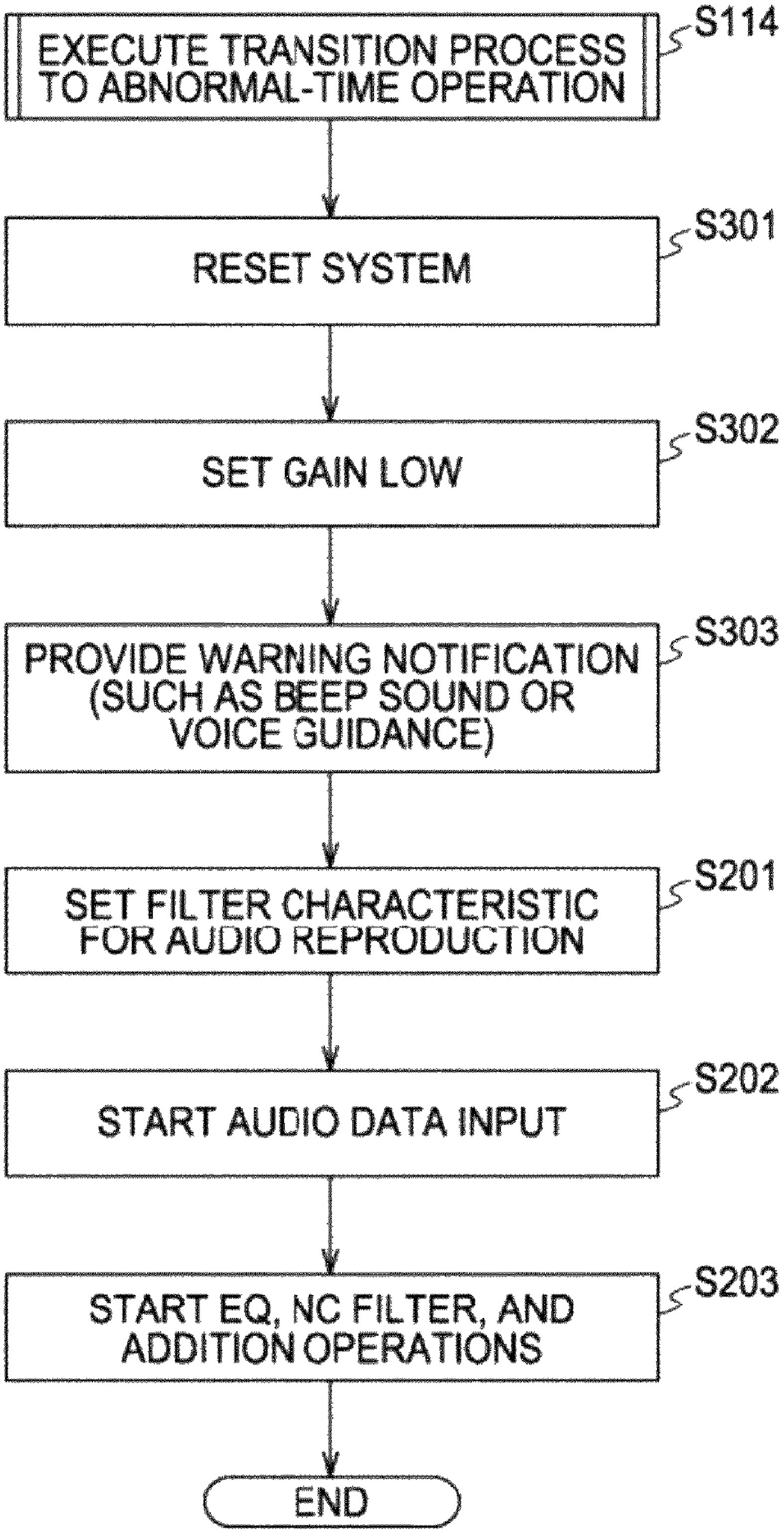
FIG. 8 is a flowchart showing the details of a transition process to an abnormal-time operation.

FIGS. 7 and 8 illustrate the details of the respective transition processes in steps S113 and S114 mentioned above.

FIG. 7 illustrates the transition process to the normal operation in step S113 mentioned above.

First, in step S201, a filter characteristic for audio reproduction is set. That is, on the basis of parameter information stored in the memory 8, a filter characteristic for audio reproduction is set for the NC filter 5*a*.

Then, in step S202 that follows, an audio data input start process is performed. That is, by controlling, for example, a switch as the input control unit 5*e*, input of the listening audio data from the A/D converter is started.

Further, in the next step S203, the operations of the equalizer 5*b*, the NC filter 5*a*, and the addition unit 5*c* are started.

Through these processes, the normal noise cancelling operation described above is started (normal operation mode).

FIG. 8 illustrates the details of the transition process to the abnormal-time operation in step S114.

In FIG. 8, first, in step S301, as a system reset process, a process of restarting the DSP 5 in such a way as to reset the settings of the DSP 5 itself is executed.

Then, in step S302, a control is performed such that a gain given to the feedback loop is set low. Specifically, by giving a coefficient of a predetermined value less than 1 to the multiplication unit 5*g*, a gain lower than that at the time of normal operation is set.

In step S303 that follows, a warning notification process is performed. Specifically, by adding the warning sound data 8*a* stored in the memory 8 in, for example, the addition unit 5*c*, a sound based on the warning sound data is outputted from the driver DRV.

After the process in step S303 is executed, the same processes as those in steps S201 to S203 are executed as shown in the drawing. Thus, if it is determined by the self-check operation that there is an abnormality, after the system is reset, a warning is made to the user, and a gain lower than that at the time of normal operation is set for the feedback loop. In this state, a noise cancelling operation including audio reproduction is executed (abnormal-time operation mode).

With the self-check operation according to this embodiment described above, occurrence or non-occurrence of an abnormality such as an unusual sound or oscillation can be checked in advance prior to actually performing sound reproduction. This makes it possible to take appropriate countermeasures in advance in such situations as when an abnormality such as an unusual sound or oscillation will occur, thus realizing a superior noise cancelling system that does not give the user discomfort due to an unusual sound or is free from the risk of oscillation.

As the specific countermeasures, in this embodiment, after the system is reset as mentioned above, warning is given to the user, a gain lower than that at the time of normal operation is set, and audio reproduction and a noise cancelling operation are performed in that state.

By performing the system reset, in cases where the cause of an unusual sound or oscillation is an abnormality in a digital device, this can be resolved, thereby making it possible to prevent occurrence of an abnormal sound thereafter.

By making the warning notification, the user can be reliably notified of the fact that an abnormality has been detected.

By setting the gain low, it is possible to achieve reduction of discomfort due to an unusual sound, or protection of the user's ears in the event an oscillation should occur.

It should be noted that since the self-check operation according to this example is performed upon detecting an abnormal sound that has actually occurred, there is a possibility of a slight abnormal sound being listened to by the user momentarily. However, by taking these countermeasures (in particular, the system reset and the setting of a low gain), it is possible to prevent the abnormal sound from being listened to continuously thereafter (or reduce the abnormal sound). In this respect, reduction of user discomfort and protection of the user's ears can be appropriately achieved.

Also, in this embodiment, the self check operation is performed after making a setting such that the noise cancelling operation is performed in a state in which no reproduced sound with respect to the listening audio data is contained. This makes it possible to enhance the accuracy of determination of the occurrence or non-occurrence of an abnormality.

<Second Embodiment>

Next, a second embodiment of the present invention will be described.

Figure 9:
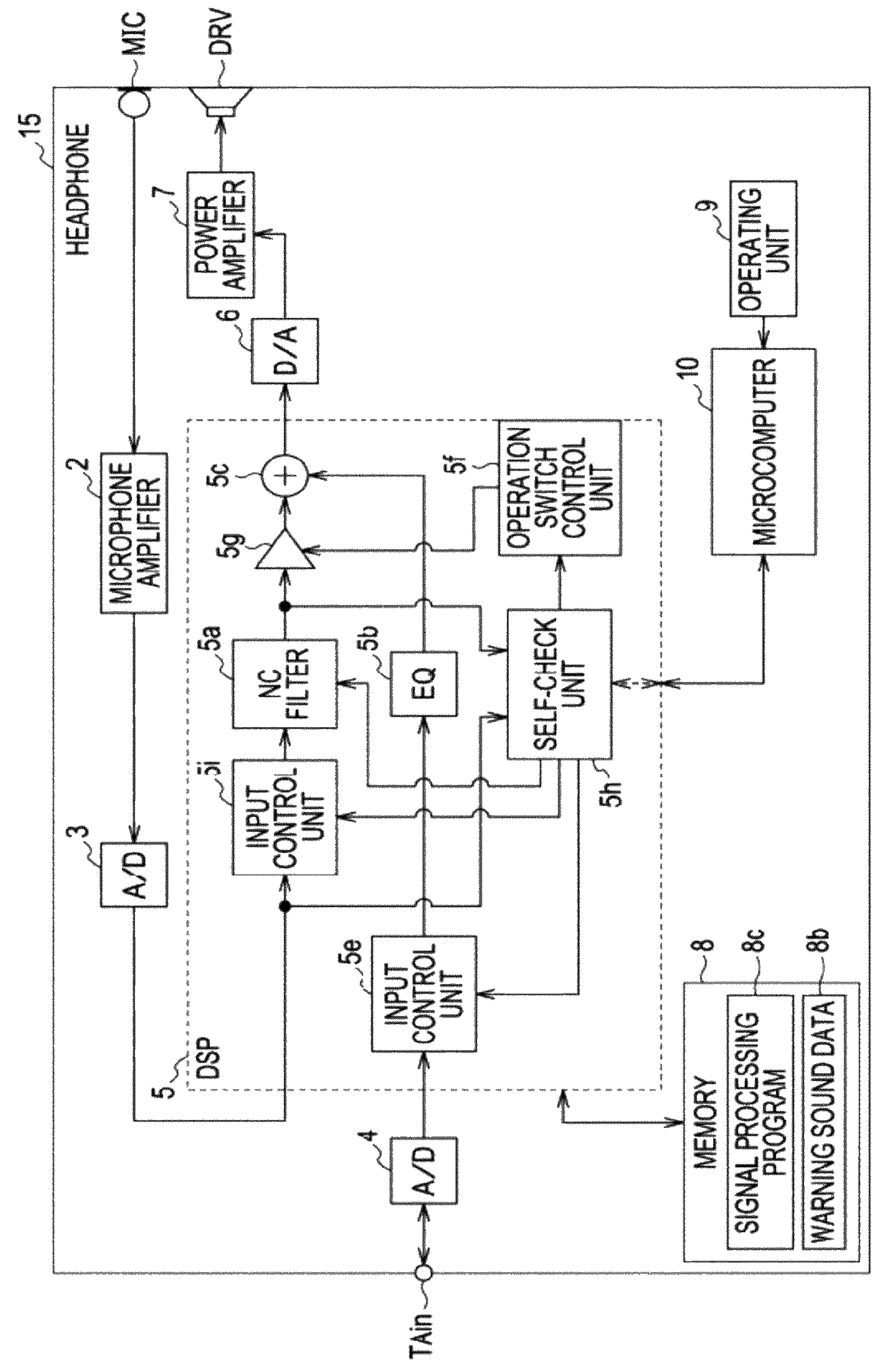
FIG. 9 is a block diagram showing the internal configuration of a headphone device according to a second embodiment.

FIG. 9 is a block diagram showing the internal configuration of a headphone 15 according to the second embodiment. In the following, portions that are the same as those already described above are denoted by the same reference numerals and description thereof is omitted.

The second embodiment represents a partial modification of the self-check operation described above with reference to the first embodiment. In this respect, in the headphone 15 according to the second embodiment, the self-check unit 5*d* in the headphone 1 according to the first embodiment mentioned above is modified to a self-check unit 5*h*.

The DSP 5 in this case is also given a function as an input control unit 5i shown in the drawing. The input control unit 5*i* controls the input (input/non-input) of sound pickup data inputted to the NC filter 5*a*, among the pieces of sound pickup data that are inputted from the A/D converter 3 and branched for input to the NC filter 5*a* and the self-check unit 5*h*.

In accordance with the fact that a functional operation different from that in the first embodiment is realized by the DSP 5, a signal processing program 8*c* is stored in the memory 8 in this case, instead of the signal processing program 8*a*.

Figure 10:
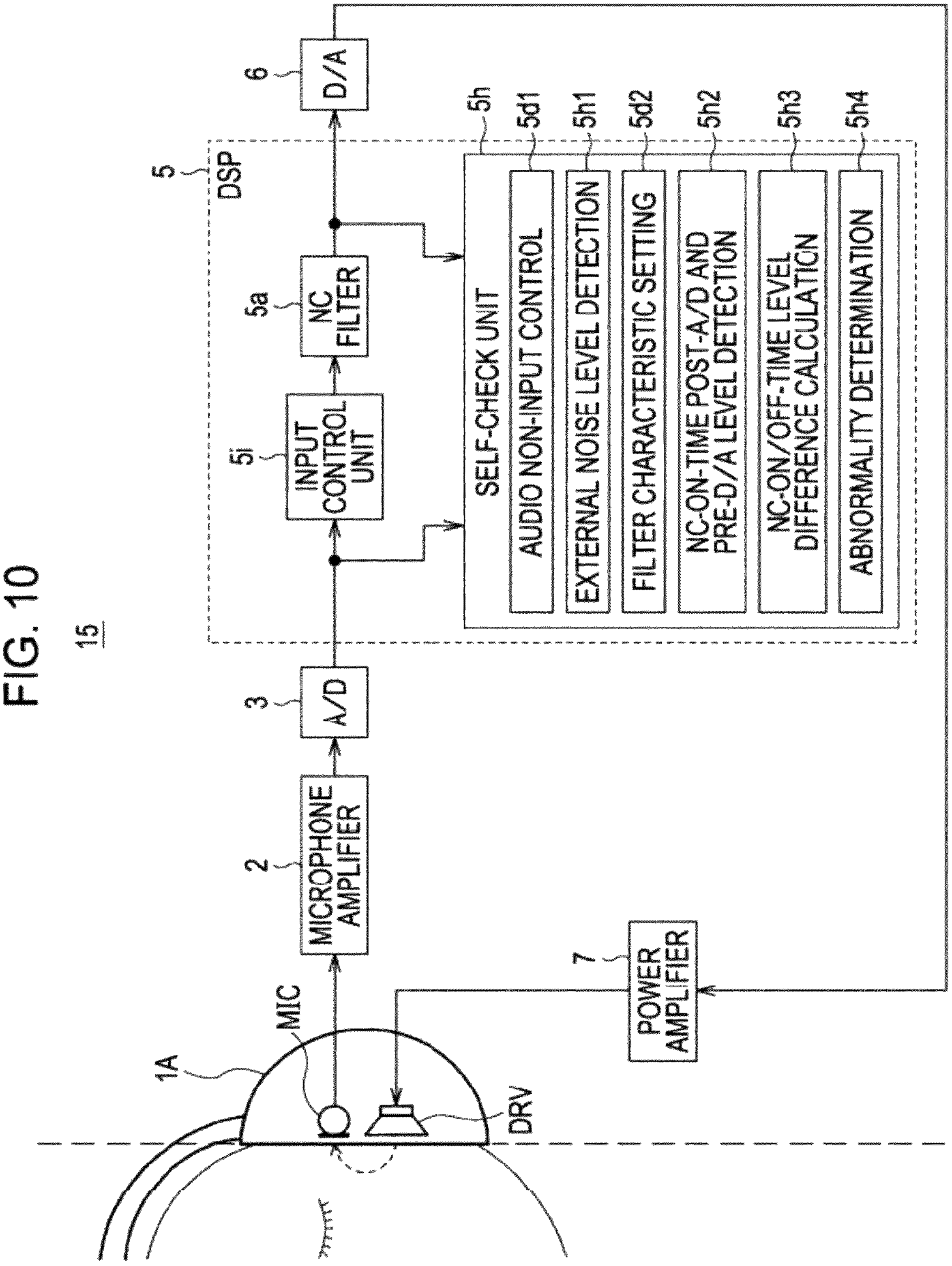
FIG. 10 is a diagram illustrating a self-check operation according to the second embodiment.

FIG. 10 is a diagram illustrating a self-check operation according to the second embodiment, which is realized by the self-check unit 5*h* mentioned above.

In FIG. 10 as well, as in FIG. 5 above, portions related to the self-check operation are extracted and shown from among the components of the headphone 15 shown in FIG. 9.

In this drawing as well, the relative placement of the driver DRV and the microphone MIC inside the housing unit 1A of the headphone 15 is also shown. As is apparent from this relative placement, the headphone 15 according to the second embodiment also adopts the FB scheme as the noise cancelling scheme.

In the self-check operation according to the second embodiment, prior to detecting the sound signal level in a state in which a noise cancelling (NC) operation not including audio reproduction is performed, the level of an external noise is detected as a reference level in advance in a state with the NC operation turned OFF, and whether or not an abnormal sound has occurred is determined on the basis of the difference between the reference level and the sound signal level detected while actually performing the NC operation.

First, as for the functions that the self check unit 5*h* has in this case, since the function as the audio non-input control block 5*d*1 in the drawing is the same as that in the case of the first embodiment above, its description will not be repeated. By this functional operation as the audio non-input control block 5*d*1, a control is performed in response to a check operation start instruction such that input of listening audio data becomes a non-input state.

Then, in this case, after the operation as the audio non-input control block 5*d*1 mentioned above is performed, the level of an external noise sound is detected by an external noise level detection block 5*h*1.

As the external noise level detection block 5*h*1, first, a control is performed by the input control unit 5*i* such that sound pickup data from the AD converter 3 is not inputted to the NC filter 5*a*. Thus, the feedback loop is switched OFF so that a cancelling operation for an external noise sound picked up by the microphone MIC is not performed (NC operation is switched OFF).

Then, the level of an input signal from the A/D converter 3 is detected.

Information of the level of the input signal from the A/D converter 3 thus detected is stored into the memory 8 as information serving as a reference level at the time of an abnormality determination described later.

After the operation as the external noise level detection block 5*h*1 mentioned above, the operation of the filter characteristic setting block 5*d*2 is performed. That is, as described above with reference to the first embodiment, a filter characteristic for checking is set for the NC filter 5*a*.

Next, by an NC-ON-time post-A/D and pre-D/A level detection block 5*h* 3, in a state with the NC operation started, the output signal level from the A/D converter 3, and the input signal level to the D/A converter 6 are detected. Specifically, after a control is performed by the input control unit 5*i* such that sound pickup data from the A/D converter 3 is inputted to the NC filter 5*a*, and after filtering with the NC filter 5*a* is started, the output signal level from the A/D converter 3, and the input signal level to the D/A converter 6 are detected.

Further, an NC-ON/OFF-time level difference calculating block 5*h* 3 calculates the difference between the reference level (external noise level) stored in the memory 8 as described above, and the level detected by the NC-ON-time post-A/D and pre-D/A level detection block 5*h* 3 mentioned above. Specifically, [Lev1-LevR] and [Lex2-LevR] are calculated, where LevR represents the above-mentioned reference level, Lev1 represents the output signal level from the A/D converter 3 detected by the NC-ON/OFF-time level difference calculating block 5*h*3 mentioned above, and Lev2 represents the input signal level to the D/A converter 6.

Then, an abnormality determination block 5*h*4 performs an abnormality determination based on information of the level difference thus calculated. That is, it is determined whether or not the level difference based on [Lev1-LevR] mentioned above, and the level difference based on [Lev2-LevR] mentioned above are excessively small, and if it is determined that one of the level differences is excessively small, a determination result indicative of the presence of an abnormal sound is obtained, and if it is determined that neither of the level differences is excessively small, a determination result indicative of the absence of an abnormal sound is obtained.

Specifically, the determination as to whether or not each of the level difference based on [Lev1-LevR] mentioned above, and the level difference based on [Lev2-LevR] mentioned above is made by determining whether or not the value of this level difference is equal to or lower than a predetermined threshold (referred to as third threshold) defined in advance.

It should be noted that when, for example, the values of the level difference based on [Lev1-LevR] mentioned above and the level difference based on [Lev2-LevR] mentioned above are determined to be excessively small, such as when the values become negative values, it is presumed that the sound signal level at the time of NC operation has become excessively high due to an unusual sound or oscillation. Therefore, as in the first embodiment, the operation of the abnormality determination block 5*h*4 mentioned above also makes it possible to appropriately determine the occurrence or non-occurrence of an abnormal sound due to occurrence of an unusual sound or oscillation.

As can be appreciated from the fact that the operation switch control unit 5*f*, the multiplication unit 5*g*, and the warning sound data 8*b* are shown in FIG. 9 described above, in the second embodiment as well, after a determination is made as to the presence/absence of an abnormality by the self-check operation, on the basis of the determination result, a transition to the normal operation mode/abnormal-time operation mode is made in the same manner as in the first embodiment. Since the details about such an operation has already been described, description thereof will not be repeated.

Figure 11:
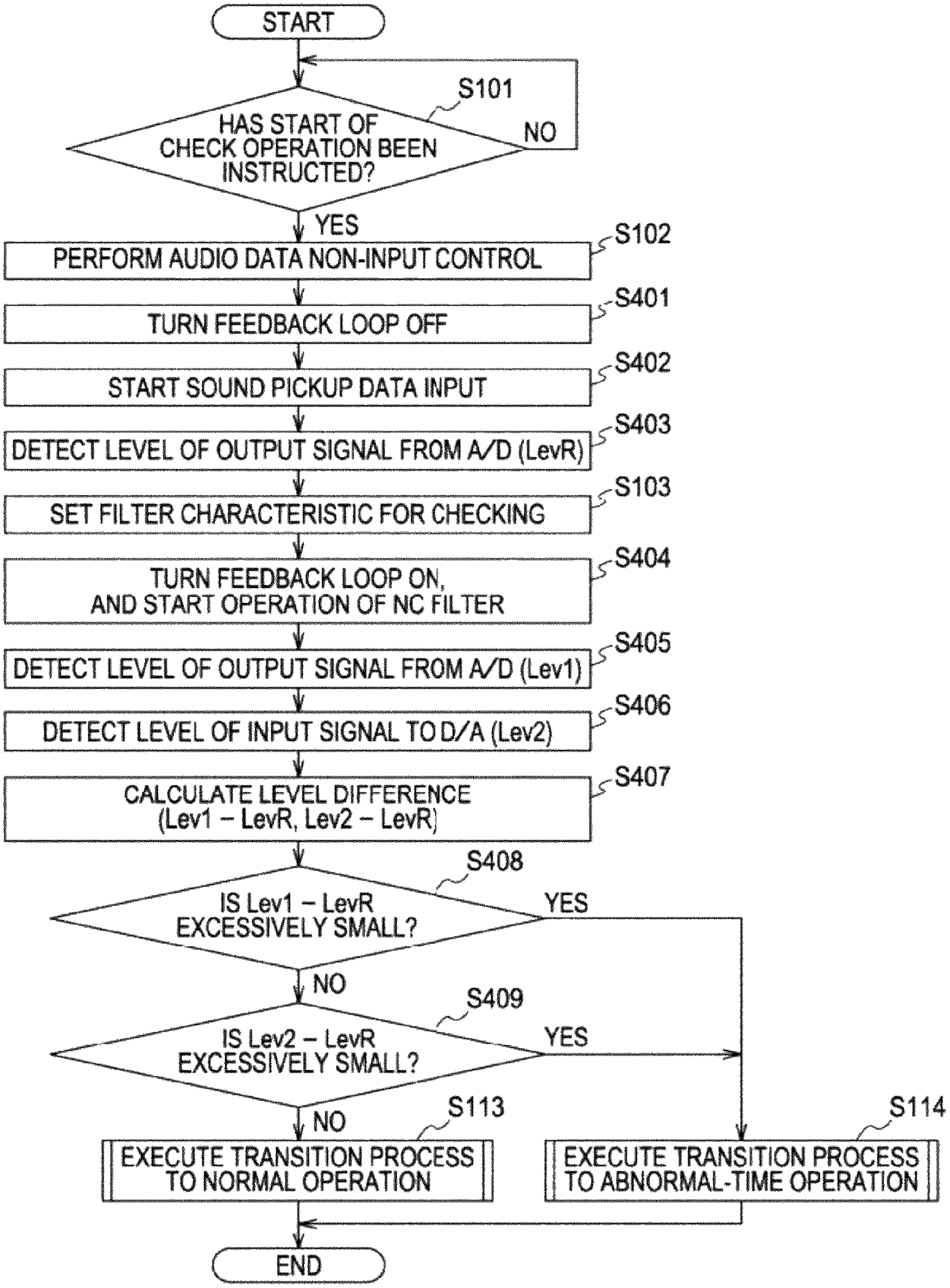
FIG. 11 is a flowchart showing a procedure for realizing the self-check operation (and operation switch control) according to the second embodiment.

The flowchart in FIG. 11 shows a procedure for realizing the self-check operation according to the second embodiment described above. In FIG. 11, the procedure for realizing the self-check operation according to the second embodiment is shown as a procedure that is executed by the DSP 5 on the basis of the signal processing program 8*c*.

In FIG. 11, to clarify differences from the processing according to the first embodiment, the same processes as those described above with reference to FIG. 6 are denoted by the same step numbers.

In FIG. 11 as well, first, in step S101, a check operation start instruction from the microcomputer 10 is waited for. When the above-mentioned check operation start instruction is made, in step S102, an audio data non-input control process is performed.

Then, in this case, after the execution of the non-input control process in step S102 mentioned above, in step S401, a feedback loop OFF process is executed. That is, by controlling, for example, a switch as the input control unit 5*i* shown in FIG. 9, a control is performed such that sound pickup data from the A/D converter 3 is not inputted to the NC filter 5*a*.

In step S402 that follows, input of the sound pickup data from the A/D converter 3 mentioned above is started.

Then, in step S403 that follows, the level of an output signal from the A/D converter 3 is detected. That is, the level (LevR) of sound pickup data supplied from the A/D converter 3 is detected. As previously described, the level LevR thus detected is held in the memory 8 as reference level information.

When the process in step S403 mentioned above is executed, in step S103, the process of setting a filter characteristic for checking is executed.

Then, in the next step S404, the feedback loop is turned ON, and the operation of the NC filter 5*a* is started. That is, a control is performed by the input control unit 5*i* such that the sound pickup data from the A/D converter 3 is inputted to the NC filter 5*a*, and filtering with the NC filter 5*a* is started.

In step S405 that follows, the level (Lev1) of an output signal from the A/D converter 3 is detected. Further, in the next step S406, the level (Lev2) of an input signal to the D/A converter 6 is detected.

Then, calculation of a level difference is performed in the next step S407. That is, [Lev1-LevR] and [Lev2-LevR] are calculated with respect to the external noise level LevR detected in step S403 mentioned above, the output signal level Lev1 from the A/D converter 3 which is detected in step S405 mentioned above, and the input signal level Lev2 to the D/A converter 6 detected in step S406 mentioned above.

Then, in the next step S408, it is determined whether or not the level difference based on [Lev1-LevR] is excessively small. Specifically, it is determined whether or not the level difference based on [Lev1-LevR] is equal to or less than the third threshold described above.

If a negative determination result that the value of the level difference based on [Lev1-LevR] is not equal to or higher than the third threshold mentioned above is obtained in step S408, in step S409, it is determined whether or not the value of the level difference based on [Lev2-LevR] is excessively small (whether or not the value is equal to or less than the third threshold mentioned above). If a negative determination result that the value of [Lev2-LevR] is not equal to or less than the third threshold mentioned above is obtained, the processing proceeds to the transition process to the normal operation in step S113.

On the other hand, if a positive determination result is obtained in one of the determination processes in steps S408 and S409 mentioned above, that is, if the value of one of the level differences is determined to be excessively small, the transition process to the abnormal-time operation in step S114 is executed.

In this case as well, upon executing the transition process in either step S113 or step S114 mentioned above, the self-check operation (and the operation switch control) according to this embodiment ends.

By the self-check operation according to the second embodiment described above as well, the presence/absence of an abnormality such as an unusual sound or oscillation can be checked in advance prior to actually performing sound reproduction.

In this regard, in the first embodiment described above, the self-check operation is performed solely on the basis of the sound signal level detected in a state with the noise cancelling operation executed. Thus, there is a fear that, depending on the level of an external noise occurring at that time, it may become difficult to accurately determine the presence/absence of an abnormal sound. In contrast, with the self-check operation according to the second embodiment mentioned above, an external noise level is detected in advance as a reference level, and an abnormality determination is performed on the basis of the difference between the reference level and the level detected at the time of NC operation. Thus, the determination can be performed with greater accuracy irrespective of the level of noise that occurs externally.

In the second embodiment, a determination of the presence/absence of an abnormal sound based on the result of frequency characteristic analysis of a sound signal is not performed as a self-check operation. However, in the second embodiment as well, it is of course possible to perform such a determination of the presence/absence of an abnormal sound on the basis of the result of frequency characteristic analysis.

In that case, at the time of detection of an external noise level to be performed in advance, an amplitude level of a predetermined frequency range in which an unusual sound/oscillation sound is expected to occur, and the presence/absence of an abnormal sound may be detected on the basis of the result of determination as to whether or not the difference between the external noise level, and the amplitude level of the predetermined frequency range detected later when the NC operation is ON is equal to or less than a predetermined threshold.

<Third Embodiment>

A third embodiment of the present invention relates to a sound reproduction system including a headphone device and a signal processing device such as an audio player to and from which the headphone device can be attached and detached, in which the signal processing system for noise cancelling is not included on the headphone device side but on the signal processing device side. Specifically, the third embodiment relates to a sound reproduction system including an audio player (30) with a noise cancelling function, and a (typical) headphone (20) with no noise cancelling function.

Figure 12:
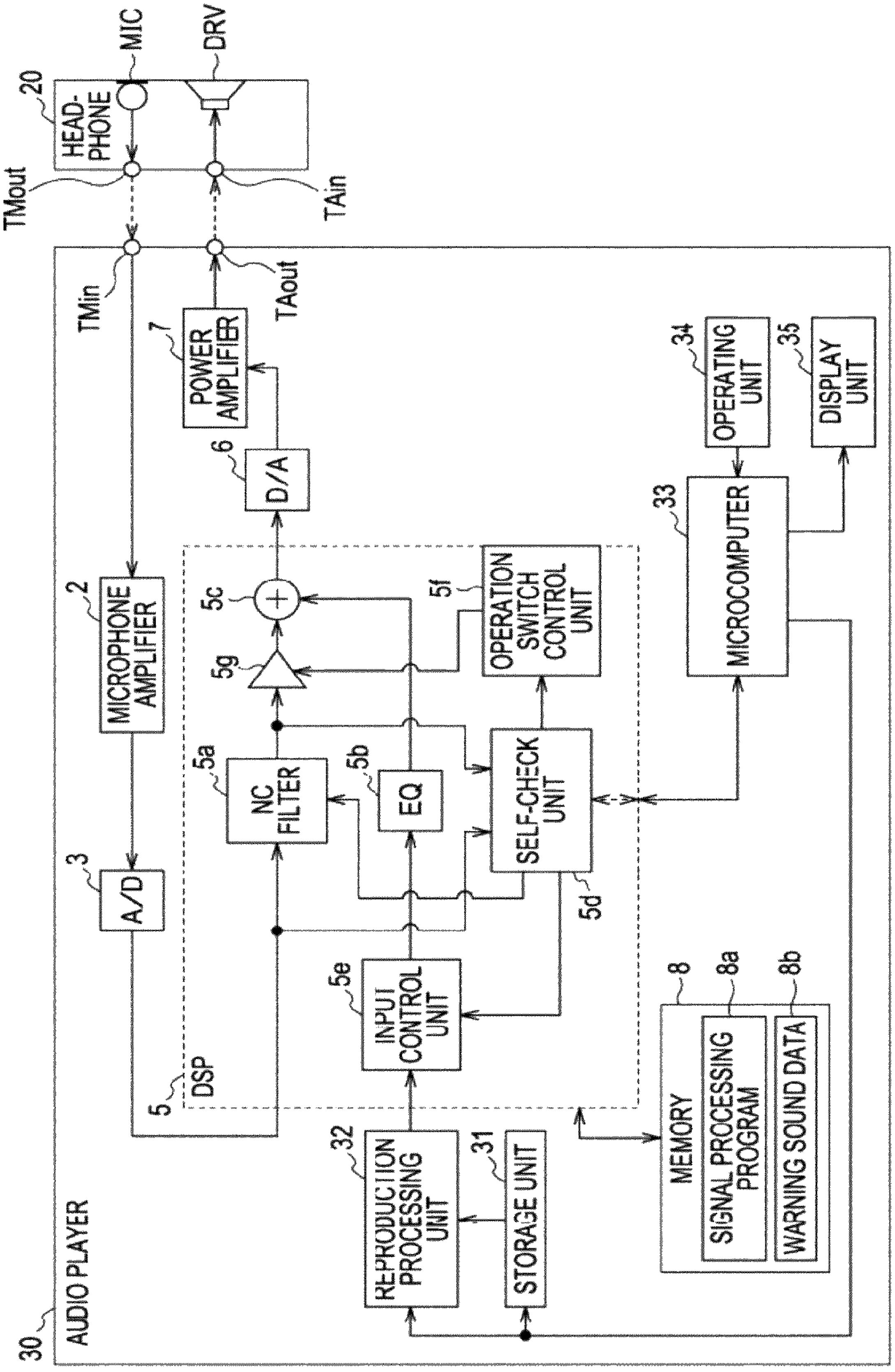
FIG. 12 is a diagram illustrating the configuration of a sound reproduction system according to a third embodiment.

FIG. 12 is a block diagram illustrating, as the configuration of the sound reproduction system according to the third embodiment, the internal configuration of the audio player 30 and the internal configuration of the headphone 20.

First, the headphone 20 in this case includes the microphone MIC, a microphone output terminal TMout, an audio input terminal TAin, and the driver DRV. A sound pickup signal obtained by the microphone MIC is supplied to the microphone output terminal TMout mentioned above. The audio input terminal TAin mentioned above is connected to the driver DRV.

On the other hand, as can be appreciated from comparison with FIG. 4 described above, the audio player 30 includes a sound signal processing system of the same configuration as the sound signal processing system for noise cancelling which is included in the headphone 1 according to the first embodiment. Specifically, the audio player 30 has the microphone amplifier 2, the A/D converter 3, the DSP 5 (and the memory 8), the D/A converter 6, and the power amplifier 7 that are included in the headphone 1. The operations of individual units of the sound signal processing system for noise cancelling are the same as those described above, so description thereof will not be repeated.

In this case, a sound pickup signal obtained by the microphone MIC is supplied to the microphone amplifier 2, from the microphone output terminal TMout via the microphone input terminal TMin provided on the audio player 30 side described above. The output signal of the power amplifier 7 is supplied to the driver DRV, from the audio output terminal TMout provided on the audio player 30 side via the audio input terminal TAin described above.

The above-mentioned respective terminals T, namely the microphone output terminal TMout and the audio input terminal TAin, and the microphone input terminal TMin and the audio output terminal TMout, are formed on the headphone 20 side and on the audio player 30 side, respectively, such that when the headphone 20 is connected to the audio player 30, these terminals T connect to each other in accordance with the following combinations: [microphone output terminal TMout-microphone input terminal TMin] and [audio output terminal TMout-audio input terminal TMin].

The audio player 30 includes, as the reproduction system for audio data, a storage unit 31 and a reproduction processing unit 32.

The above-mentioned storage unit 31 is used for storage of various kinds of data including audio data. As for its specific configuration, for example, the storage unit 31 may be configured to perform writing (recording)/reading of data to/from a solid memory such as a flash memory, or may be configured by, for example, an HDD (Hard Disk Drive).

The storage unit 31 may also be configured as a drive device or the like that does not support a built-in recording medium but a flexible recording medium, for example, a recording medium such as a memory card with a built-in solid memory, an optical disc such as a CD (Compact Disc) or a DVD (Digital Versatile Disc), a magneto-optical disc, or a hologram memory.

Of course, both a built-in type memory such as a solid memory or an HDD, and a drive device for a flexible recording medium may be installed.

The storage unit 31 performs writing/reading of various kinds of data including audio data on the basis of control executed by a microcomputer 33 described later.

It is assumed that in the storage unit 31 mentioned above, audio data is stored while being compressed and encoded in a predetermined sound compression and encoding scheme. Compressed audio data read by the storage unit 31 is supplied to the reproduction processing unit 32. On the basis of control executed by the microcomputer 33, the reproduction processing unit 32 applies predetermined reproduction processing (decode processing) such as decompression to the supplied audio data.

The audio data having undergone the reproduction processing in the reproduction processing unit 32 is supplied to the DSP 5 as listening audio data.

The microcomputer 33 performs overall control of the audio player 30.

For example, the microcomputer 33 controls the writing/reading of data to/from the storage unit 31 described above. The microcomputer 33 also controls the start/stop of reproduction of audio data by controlling the storage unit 31 and the reproduction processing unit 32.

The microcomputer 33 is connected with an operating unit 34, and performs computations and operation controls of individual units on the basis of operation input information based on a user operation input supplied from the operating unit 34. Thus, an operation of the audio player 30 according to a user's operation is attained.

Also, the microcomputer 33 is connected with a display unit 35. The display unit 35 is configured as a display device such as a liquid crystal display or an organic EL display, and displays desired information in response to an instruction from the microcomputer 33.

According to this configuration shown in FIG. 12 as well, the same self-check operation and the operation switch control as those of the first embodiment described above can be performed. In addition, by changing the signal processing program 8*a* stored in the memory 8 to the signal processing program 8*c* shown in FIG. 9 above, the same self-check operation and the operation switch control as those of the second embodiment described above can be performed.

The respective embodiments mentioned above are directed to a case in which, since the sound signal processing system for noise cancelling is provided on the headphone device side, the starting trigger for a self-check operation is set as the turning-ON of the power of the headphone device. However, in the third embodiment, the sound signal processing system for noise cancelling is provided on the audio player 30 side, so the starting trigger for a self-check operation may be set as, for example, the turning-ON of the power of the audio player 30, or the starting of reproduction of listening audio data. Alternatively, in this case, the self-check operation may be started in response to the connection of the headphone 20. In that case, the audio player 30 may be provided with, for example, connection detecting means configured by a mechanical switch or the like that turns ON/OFF in accordance with whether or not the headphone 20 has been connected, so that the microcomputer 30 issues a self-check operation start instruction to the DSP 5 in response to a notification of detected connection from the connection detecting means.

The sound reproduction system (noise cancelling system) according to the third embodiment described above is configured as a system in which the sound signal processing system for noise cancelling is provided on the side of the signal processing device to/from which the headphone device can be attached/detached.

In such a system, an abnormality can occur not only due to time variation or the like of acoustic parts such as the microphone MIC and the driver DRV, but also when the user connects a non-compatible headphone device to the signal processing device side by mistake.

Accordingly, with the configuration according to the third embodiment shown in FIG. 12, an abnormality such as an unusual sound or oscillation can be checked in advance also for situations where an abnormality such as an unusual sound or oscillation occurs when a non-compatible headphone device is connected as described above. Then, in accordance with the check result, appropriate countermeasures can be taken in the event an abnormality occurs.

In the third embodiment, similarly to the respective embodiments mentioned above, a warning for notifying occurrence of an abnormality is provided by voice. In this case, since the display unit 35 is provided on the audio player 30 side, a warning display may be made on the display unit 35. In that case, information on the result of determination of the presence/absence of an abnormality is given from the DSP 5 (self-check unit 5*d*) to the microcomputer 33, and on the basis of this determination result information, the microcomputer 33 causes display information for notifying occurrence of an abnormality, such as text information set in advance, to be displayed on the display unit 35.

[Modification]

While embodiments of the present invention have been described above, the present invention should not be construed as being limited to the specific examples described in the foregoing.

For example, the foregoing description is directed to the case where, for the sake of brevity, the number of chs (channels) of a sound signal (including a sound pickup signal) is set as only 1 ch. However, the present invention can be also suitably applied to cases where sound reproduction is performed with respect to a sound signal of multiple chs. In the case, the above-described self-check operation may be performed on a per-ch basis.

In the above embodiments, the occurrence or non-occurrence of an abnormal sound is determined on the basis of the analysis result of frequency characteristics. At this time, it is conceivable that depending on the kind of the cause of occurrence of an abnormality, the frequency range in which an unusual sound or oscillation occurs may vary. Accordingly, the abnormality determination based on the frequency analysis result can be also configured such that level detection and an abnormal sound occurrence determination are performed for each frequency range, and if there is a frequency range in which an abnormal sound is present, the cause of occurrence is identified from that frequency range. At this time, a configuration can be also employed in which correspondence information representing the correspondence between frequency ranges and causes of occurrence is stored in the memory 8 or the like in advance, and on the basis of this correspondence information, the user is notified of an identified cause of occurrence.

In the second embodiment, the difference between the external noise level detected in advance, and the level detected when the NC operates can be utilized as information indicating the result of measurement of the NC effect (measurement of the amount of noise attenuation by the NC). In this respect, whether or not an expected NC effect has been attained may be checked on the basis of the information of the calculated level difference.

The foregoing description is directed to the case where a self-check operation is performed in the noise cancelling system of the FB scheme. However, even in cases where other noise cancelling schemes, such as the FF scheme and the adaptive signal processing scheme (a scheme in which the filter characteristics of the NC filter are adaptively varied on the basis of the result of measurement of a noise reduction amount) are adopted, for example, there is a fear of an abnormality occurring as the gain becomes excessively large due to, for example, a breakdown or the like. The present invention can be suitably applied to such cases as well.

The foregoing description is directed to the case where the filter (NC filter) that gives a noise-cancelling signal characteristic is configured by a digital filter. However, the NC filter can be also configured by an analog filter.

The foregoing description is directed to the case where, at the time of the self-check operation, the level of a sound signal (including the level with respect to a given frequency range) is detected at positions immediately before and immediately after the NC filter. However, the detection may be performed at one of these positions. Alternatively, even at positions other than the position immediately before or immediately after the NC filter, if the level of a sound signal obtained within the sound signal processing system for noise cancelling is detected, occurrence or non-occurrence of an abnormal sound can be determined appropriately on the basis of the detected level.

The foregoing description is directed to the case where the signal processing device according to each of the embodiments of the present invention is configured as an audio player. However, the signal processing device according to each of the embodiments of the present invention can be also implemented in other forms of device, such as a mobile telephone or a headset with a noise cancelling function.

It should be understood by those skilled in the art that various modifications, combinations, sub-combinations and alterations may occur depending on design requirements and other factors insofar as they are within the scope of the appended claims or the equivalents thereof.

What is claimed is:

1. A headphone device comprising:

sound reproduction means having a diaphragm for performing sound reproduction based on a sound signal;

sound pickup means for performing a sound pickup operation;

filtering means for applying filtering to a picked-up sound signal, which is obtained based on the sound pickup operation by the sound pickup means, to give a noise-cancelling signal characteristic;

combining means for combining the picked-up sound signal that has undergone filtering by the filtering means, and a listening sound signal which is inputted separately as a sound to be listened to by a user, to generate a sound signal supplied to the sound reproduction means;

abnormality determination means for determining occurrence or non-occurrence of an abnormal sound, based on a result of detecting a level of a sound signal obtained within a sound signal processing system, the sound signal processing system including the filtering means and the combining means and being coupled between the sound pickup means and the sound reproduction means, and control means for performing a control such that a warning notification is provided, in response to a determination made by the abnormality determination means that an abnormality is present.

2. The headphone device according to claim 1, wherein:

the abnormality determination means detects the level of the sound signal after performing a control such that the listening sound signal is not supplied to the sound reproduction means.

3. The headphone device according to claim 2, wherein:

the sound pickup means is provided so as to pick up a sound reproduced by the sound reproduction means, forming a noise cancelling system based on a feedback scheme.

4. The headphone device according to claim 3, wherein the abnormality determination means detects, as a reference sound pickup level, a pre-filtering level of the picked-up sound signal that is inputted to the filtering means, after performing a control such that the picked-up sound signal that has undergone filtering by the filtering means is not supplied to the sound reproduction means, detects, as a level at noise cancellation, the level of the sound signal obtained within the sound signal processing system, after performing a control such that the picked-up sound signal that has undergone filtering by the filtering means is supplied to the sound reproduction means, and finds a level difference between the level at noise cancellation and the reference sound pickup level, and determines the occurrence or non-occurrence of the abnormal sound based on the level difference.

5. The headphone device according to claim 2, wherein:

the abnormality determination means determines the occurrence or non-occurrence of the abnormal sound based on a size relationship between the detected level of the sound signal and a preset level.

6. The headphone device according to claim 2, wherein:

the abnormality determination means detects a pre-filtering level of the picked-up sound signal that is inputted to the filtering means.

7. The headphone device according to claim 2, wherein:

the abnormality determination means detects a post-filtering level of the picked-up sound signal to which filtering has been applied by the filtering means.

8. The headphone device according to claim 2, wherein:

the abnormality determination means detects at least a level of a predetermined frequency range of the sound signal, as the level of the sound signal.

9. The headphone device according to claim 8, wherein:

the abnormality determination means determines the occurrence or non-occurrence of the abnormal sound based on a size relationship between the level of the predetermined frequency range of the sound signal and a preset level.

10. The headphone device according to claim 1, further comprising:

gain adjusting means for adjusting a gain of a sound signal inserted into the sound signal processing system and supplied to the sound reproduction means; and control means for controlling the gain adjusting means so that a gain given to the sound signal supplied to the sound reproduction means is reduced, in response to a determination made by the abnormality determination means that an abnormality is present.

11. The headphone device according to claim 1, wherein:

the filtering means, the combining means, and the abnormality determination means are realized by digital signal processing by a digital signal processor; and the headphone device further comprises an A/D converter that converts the picked-up sound signal that is an analog signal obtained based on the sound pickup operation by the sound pickup means, into a digital signal, and supplies the digital signal to the digital signal processor, and a D/A converter that converts a combined signal obtained by signal processing by the digital signal processor as the combining means, into an analog signal.

12. The headphone device according to claim 11, wherein: the digital signal processor performs a restart such that its own settings are reset, in response to a determination result that an abnormality is present which is obtained by a functional operation as the abnormality determination means.

13. A signal processing device comprising:

filtering means for applying filtering to a picked-up sound signal to give a noise-cancelling signal characteristic, in a headphone device including sound reproduction means having a diaphragm for performing sound reproduction based on a sound signal, and sound pickup means for performing a sound pickup operation, the picked-up sound signal being obtained based on the sound pickup operation by the sound pickup means;

combining means for combining the picked-up sound signal that has undergone filtering by the filtering means, and a listening sound signal which is inputted separately as a sound to be listened to by a user, to generate a sound signal supplied to the sound reproduction means of the headphone device;

abnormality determination means for determining occurrence or non-occurrence of an abnormal sound, based on a result of detecting a level of a sound signal obtained within a sound signal processing system, the sound signal processing system including the filtering means and the combining means and being coupled between the sound pickup means and the sound reproduction means; and display means for displaying information;

control means for performing a control such that, in response to a determination made by the abnormality determination means that an abnormality is present, information to that effect is displayed by the display means.

14. A headphone device comprising:

a sound reproduction unit having a diaphragm which is configured to perform sound reproduction based on a sound signal;

a sound pickup unit configured to perform a sound pickup operation;

a filtering unit configured to apply filtering to a picked-up sound signal, which is obtained based on the sound pickup operation by the sound pickup unit, to give a noise-cancelling signal characteristic;

a combining unit configured to combine the picked-up sound signal that has undergone filtering by the filtering unit, and a listening sound signal which is inputted separately as a sound to be listened to by a user, to generate a sound signal supplied to the sound reproduction unit;

an abnormality determination unit configured to determine occurrence or non-occurrence of an abnormal sound, based on a result of detecting a level of a sound signal obtained within a sound signal processing system, the sound signal processing system including the filtering unit and the combining unit and being coupled between the sound pickup unit and the sound reproduction unit; and a control unit that controls the provision of a warning notification in response to a determination that an abnormality is present made by the abnormality determination unit.

15. A signal processing device comprising:

a filtering unit configured to apply filtering to a picked-up sound signal to give a noise-cancelling signal characteristic, in a headphone device including a sound reproduction unit having a diaphragm which is configured to perform sound reproduction based on a sound signal, and a sound pickup unit configured to perform a sound pickup operation, the picked-up sound signal being obtained based on the sound pickup operation by the sound pickup unit;

a combining unit configured to combine the picked-up sound signal that has undergone filtering by the filtering unit, and a listening sound signal which is inputted separately as a sound to be listened to by a user, to generate a sound signal supplied to the sound reproduction unit of the headphone device;

an abnormality determination unit configured to determine occurrence or non-occurrence of an abnormal sound, based on a result of detecting a level of a sound signal obtained within a sound signal processing system, the sound signal processing system including the filtering unit and the combining unit and being coupled between the sound pickup unit and the sound reproduction unit; and a control unit that controls the provision of a warning notification in response to a determination that an abnormality is present made by the abnormality determination unit.

* * * * *